(12) United States Patent
Naiki et al.

(10) Patent No.: US 12,302,047 B2
(45) Date of Patent: May 13, 2025

(54) TRANSDUCER AND ELECTRONIC DEVICE

(71) Applicant: ROHM CO., LTD., Kyoto (JP)

(72) Inventors: Takashi Naiki, Kyoto (JP); Noriyuki Shimoji, Kyoto (JP); Tomohiro Date, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 330 days.

(21) Appl. No.: 17/815,009

(22) Filed: Jul. 26, 2022

(65) Prior Publication Data
US 2022/0360871 A1 Nov. 10, 2022

Related U.S. Application Data

(63) Continuation of application No. PCT/JP2021/003328, filed on Jan. 29, 2021.

(30) Foreign Application Priority Data

Feb. 3, 2020 (JP) .................................. 2020-016079
Feb. 13, 2020 (JP) ................................. 2020-022510

(51) Int. Cl.
H04R 1/02 (2006.01)
H04R 17/00 (2006.01)
(Continued)

(52) U.S. Cl.
CPC ............... H04R 1/02 (2013.01); H04R 17/00 (2013.01); H10N 30/2043 (2023.02); H10N 30/872 (2023.02)

(58) Field of Classification Search
CPC ...... H04R 1/02; H04R 17/00; H04R 2217/03; H04R 19/04; H04R 7/04; H04R 7/18;
(Continued)

(56) References Cited

U.S. PATENT DOCUMENTS

2006/0186762 A1* 8/2006 Sugiura .................... H03H 3/02
310/334
2010/0038734 A1* 2/2010 Kasai .................. B81C 1/00182
257/416
(Continued)

FOREIGN PATENT DOCUMENTS

CN 1268861 10/2000
CN 105657625 6/2016
(Continued)

OTHER PUBLICATIONS

International Search Report and Written Opinion of PCT/JP2021/003328, Mar. 16, 2021, 11 pages including English translation of the International Search Report.
(Continued)

Primary Examiner — Angelica M McKinney
(74) Attorney, Agent, or Firm — HSML P.C.

(57) ABSTRACT

A transducer includes: a film support portion having a hollow portion; a vibration film displaceable in a film thickness direction; a piezoelectric element, the piezoelectric element including a pair of electrodes and a piezoelectric film; and in regions overlapping the hollow portion, a plurality of first regions having a first total film thickness which is a sum of a film thickness of the vibration film and a film thickness of the piezoelectric element, and a plurality of second regions having a second total film thickness which is a sum of a film thickness of the vibration film and a film thickness of the piezoelectric element, the second total film thickness being different from the first total film thickness. The first regions and the second regions are alternately arranged, and one of the first regions is adjacent to a connection portion between the film support portion and the vibration film.

15 Claims, 22 Drawing Sheets

(51) Int. Cl.
 *H10N 30/20* (2023.01)
 *H10N 30/87* (2023.01)

(58) Field of Classification Search
 CPC ............... H04R 2201/003; H04R 7/20; H04R 2207/021; H04R 19/005; H04R 1/04; H04R 1/2807; H04R 1/342; H04R 1/083; H04R 17/02; H04R 17/10; H04R 19/016; H04R 2201/02; H04R 2217/00; H04R 2201/029; H04R 1/222; H04R 7/16; H04R 1/28; H04R 2410/03; H04R 31/003; H04R 7/06; H04R 9/08; H10N 30/2043; H10N 30/872; B81B 3/0072; B81B 3/007; B81B 2201/0257; B81B 2203/0127; B81B 7/0032; B81B 7/0058; B81B 7/0077; B81B 2201/0235; B81B 2203/0315; B81B 2207/012; B81B 2207/09; B81B 2207/092; B81B 2207/096; B81B 7/0064; B81B 3/001; B81B 3/0051; B81B 2203/019; B81C 1/00182; B81C 1/00269; B81C 1/00888; B81C 2201/034; B81C 2203/0118; B81C 2203/032; B81C 2203/0792; H03H 3/02; B33Y 80/00; B33Y 10/00; B22F 10/28
See application file for complete search history.

(56) References Cited

U.S. PATENT DOCUMENTS

| 2011/0064250 A1* | 3/2011 | Jeong ................. H04R 17/00 29/25.35 |
| 2011/0215672 A1* | 9/2011 | Yamaoka ............ B81B 3/0072 310/300 |
| 2016/0157021 A1 | 6/2016 | Ishii et al. |

FOREIGN PATENT DOCUMENTS

| JP | 2000-333296 | 11/2000 |
| JP | 2000-350293 | 12/2000 |
| JP | 2011-066876 | 3/2011 |
| JP | 2012-105170 | 5/2012 |
| JP | 2016-111666 | 6/2016 |
| JP | 2018-170592 | 11/2018 |

OTHER PUBLICATIONS

Japanese Office Action issued in JP Application No. 2021-575762, dated Nov. 12, 2024, 11 pages, English machine translation.
Chinese Office Action issued in CN 202180012627.7, issued Feb. 22, 2025, 23 pages, English machine translation.
Japanese Office Action issued in JP 2021-575762, issued Apr. 2, 2025, 2 pages, English machine translation.

* cited by examiner

TRANSDUCER AND ELECTRONIC DEVICE

CROSS REFERENCE TO RELATED APPLICATIONS AND INCORPORATION BY REFERENCE

This is a continuation application (CA) of PCT Application No. PCT/JP2021/003328, filed on Jan. 29, 2021, which claims priority to Japan Patent Application No. P2020-016079 filed on Feb. 3, 2020 and Japan Patent Application No. P2020-022510 filed on Feb. 13, 2020, and is based upon and claims the benefit of priority from prior Japan Patent Application No. P2020-016079 filed on Feb. 3, 2020, Japan Patent Application No. P2020-022510 filed on Feb. 13, 2020, and PCT Application No. PCT/JP2021/003328, filed on Jan. 29, 2021; the entire contents of each of which are incorporated herein by reference.

BACKGROUND OF THE INVENTION

Technical Field

The present embodiment relates to a transducer and an electronic device.

Background of the Invention

Conventionally, transducers for transmitting or receiving sound waves or ultrasonic waves have been known. A transducer is used, for example, as a speaker for transmitting a sound wave, and is mounted on an earphone or a wearable terminal.

For example, there is a sound generator suitable for an earphone. This sound generator includes a coil for generating a magnetic field, and a magnet for vibrating a diaphragm by interacting with the magnetic field generated by the coil.

In speakers using a coil and a magnet, it is necessary to pass a current to the coil in order to generate a magnetic field, and thus power consumption becomes high. Accordingly, speakers using a piezoelectric element, which is formed by sandwiching a piezoelectric film from both sides with a pair of electrodes, have attracted attention. Such speakers are manufactured using MEMS (micro-electro-mechanical systems), which is a semiconductor manufacturing technique that realizes microfabrication.

SUMMARY OF THE INVENTION

One aspect of the present embodiment provides a transducer that suppresses warpage of a piezoelectric film in a direction parallel to a connection portion between a film support portion and a vibration film. Also provided is a transducer which suppresses air leakage and has resistance to impact or the like. Also provided is an electronic device having a speaker unit having a more compact housing.

DETAILED DESCRIPTION OF THE INVENTION

Figure 1:
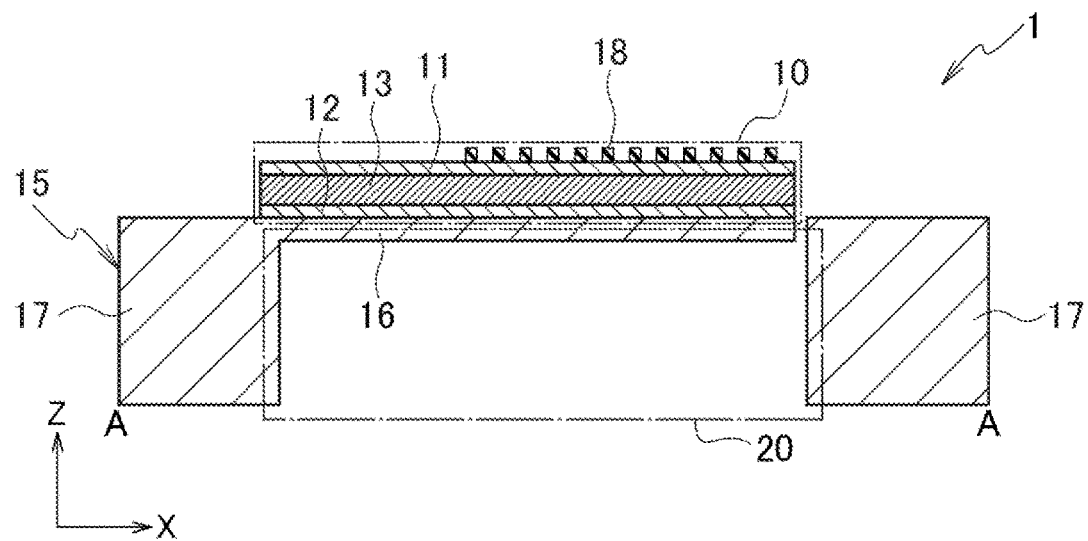
FIG. 1 is a cross-sectional view of one mode of a transducer according to a first embodiment.

Next, the present embodiment will be described with reference to the drawings. In the drawings described below, the same or similar parts are denoted by the same or similar numerals. However, it should be noted that the drawings are schematic, and the relationships between the thickness of each component and the plane dimension, etc. are different from the actual ones. Accordingly, the specific thicknesses and dimensions should be determined in consideration of the following description. Further, it is needless to say that portions having different dimensional relationships and ratios are included among the drawings.

In addition, the following embodiments illustrate devices and methods for embodying technical ideas, and do not specify the material, shape, structure, arrangement, etc. of each component. Various modifications can be made to the present embodiments in the claims.

One specific aspect of the present embodiments is as follows.

<1>

A transducer includes: a film support portion having a hollow portion; a vibration film connected to the film support portion and displaceable in a film thickness direction; a piezoelectric element on the vibration film, the piezoelectric element including a pair of electrodes and a piezoelectric film sandwiched between the pair of electrodes; and in regions overlapping the hollow portion, a plurality of first regions having a first total film thickness which is a sum of a film thickness of the vibration film and a film thickness of the piezoelectric element, and a plurality of second regions having a second total film thickness which is a sum of a film thickness of the vibration film and a film thickness of the piezoelectric element, the second total film thickness being different from the first total film thickness. The first regions and the second regions are alternately arranged, and one of the first regions is adjacent to a connection portion between the film support portion and the vibration film.

<2>

A transducer includes: a film support portion having a hollow portion; a vibration film connected to the film support portion and displaceable in a film thickness direction; a piezoelectric element on the vibration film, the piezoelectric element including a pair of electrodes, a piezoelectric film sandwiched between the pair of electrodes, and a plurality of buffer layers on the pair of electrodes; and in regions overlapping the hollow portion, first regions configured not to include the buffer layers, and second regions configured to include the buffer layers. The first regions and the second regions are alternately arranged, and one of the first regions is adjacent to a connection portion between the film support portion and the vibration film.

<3>

The transducer according to <2>, wherein the buffer layers are divided in one of the second regions.

<4>

The transducer according to <2> or <3>, wherein a width of a buffer layer in one of the second regions is larger than a width of a buffer layer in another one of the second regions provided farther than the one of the second regions from the connection portion.

<5>

The transducer according to any one of <2> to <4>, wherein a buffer layer in one of the second regions increases in width toward a central portion in a longitudinal direction.

<6>

The transducer according to any one of <2> to <5>, wherein a buffer layer include a plurality of layers made of different materials.

<7>

The transducer according to any one of <2> to <5>, wherein a quantity of layers including the buffer layers in one of the second regions is different from a quantity of layers including the buffer layers in another one of the second regions.

<8>

A transducer includes: a film support portion having a hollow portion; a vibration film connected to the film support portion and displaceable in a film thickness direction; and a piezoelectric element on the vibration film, the piezoelectric element including a pair of electrodes and a piezoelectric film sandwiched between the pair of electrodes. The vibration film includes a plurality of recesses. In regions overlapping the hollow portion, the transducer includes first regions configured not to include the recesses, and second regions configured to include the recesses, the first regions and the second regions are alternately arranged, and one of the first regions is adjacent to a connection portion between the film support portion and the vibration film.

<9>

The transducer according to <8>, wherein the recesses are arranged on a back surface of the vibration film.

<10>

The transducer according to <8> or <9>, wherein a width of a recess in one of the second regions is larger than a width of a recess in another one of the second regions provided farther than the one of the second regions from the connection portion.

<11>

The transducer according to any one of <8> to <10>, wherein a recess in one of the second regions increases in width toward a central portion in a longitudinal direction.

<12>

The transducer according to any one of <8> to <11>, wherein a depth of a recess in one of the second regions is different from a depth of a recess in another one of the second regions.

<13>

The transducer according to any one of <1> to <12>, wherein one of the second regions is parallel to the connection portion.

<14>

The transducer according to any one of <1> to <13>, wherein a width of one of the second regions is different from a width of another one of the second regions.

<15>

The transducer according to any one of <1> to <14>, wherein the piezoelectric element includes a piezoelectric slit.

<16>

A transducer includes: a piezoelectric element including a pair of electrodes and a piezoelectric film sandwiched between the pair of electrodes; a film body including a film support portion having a hollow portion, and a vibration film connected to the film support portion and displaceable in a film thickness direction, the piezoelectric element being stacked on the vibration film; and an abutment member configured to limit displacement of the vibration film. An end of the piezoelectric element includes a region overlapping the film support portion.

<17>
The transducer according to <16>, wherein the piezoelectric element and the vibration film are arranged between the hollow portion and the abutment member.

<18>
The transducer according to <16> or <17>, wherein the abutment member includes a first opening, and an end of the first opening is rounded.

<19>
The transducer according to any one of <16> to <18>, wherein the abutment member includes a first opening, and further includes a first filter covering the first opening.

<20>
The transducer according to <16> or <17>, wherein the abutment member has a plurality of first through-holes.

<21>
The transducer according to <20>, wherein the first through-holes become smaller as a distance from the vibration film increases.

<22>
The transducer according to any one of <16> to <21>, wherein a second side surface of the abutment member facing a first side surface of the abutment member near the end is formed in a tapered shape.

<23>
The transducer according to any one of <16> to <22>, wherein the first side of the abutment member includes a first slit near the end.

<24>
The transducer according to <23>, wherein the first slit has a comb-shaped structure.

<25>
The transducer according to any one of <16> to <24>, further including a substrate abutting the film body, wherein the film body is sandwiched between the substrate and the abutment member.

<26>
The transducer according to <25>, wherein the substrate includes a second opening, and an end of the second opening is rounded.

<27>
The transducer according to <25> or <26>, wherein the substrate includes a second opening, and further includes a second filter covering the second opening.

<28>
The transducer according to any one of <25> to <27>, wherein the substrate includes a plurality of second through-holes.

<29>
The transducer according to <28>, wherein the second through-holes become smaller as a distance from the vibration film increases.

<30>
The transducer according to any one of <25> to <29>, wherein a first side surface of the film support portion is formed in a tapered shape.

<31>
The transducer according to any one of <25> to <30>, wherein the first side surface of the film support portion includes a second slit on a side that is diagonal to the end.

<32>
The transducer according to <31>, wherein the second slit has a comb-shaped structure.

<33>
The transducer according to any one of <16> to <32>, further including wiring electrically connected to one of the pair of electrodes.

<34>
The transducer according to <33>, wherein the wiring is electrically connected to one of the pair of electrodes through a via provided in the film support portion.

<35>
An electronic device includes: a speaker unit including a substrate; and a bottomed cylindrical housing configured to house the speaker unit therein. The housing includes a cylindrical portion, and a bottom portion abutting the cylindrical portion, the substrate is arranged in a portion of the cylinder portion and a portion of the bottom portion, the bottom portion is separated from the cylinder portion with the speaker unit therebetween, the speaker unit is provided with a vent hole in a film thickness direction, and a space of the bottom portion communicates with outside of the housing through the vent hole.

<36>
An electronic device includes: a speaker unit including a substrate; and a bottomed cylindrical housing configured to house the speaker unit therein. The housing includes a cylindrical portion, and a bottom portion abutting the cylindrical portion, the substrate is arranged in a portion of the cylinder portion and a portion of the bottom portion, the bottom portion is separated from the cylinder portion with the speaker unit therebetween, the speaker unit is provided with a vent hole in a side surface, and a space of the bottom portion communicates with outside of the housing through the vent hole.

<37>
The electronic device according to <35> or <36>, wherein the speaker unit includes a transducer, the transducer includes: a piezoelectric element including a pair of electrodes and a piezoelectric film sandwiched between the pair of electrodes; a film body including a film support portion having a hollow portion, and a vibration film connected to the film support portion and displaceable in a film thickness direction, the piezoelectric element being stacked on the vibration film; and an abutment member configured to limit displacement of the vibration film. An end of the piezoelectric element includes a region overlapping the film support portion.

The transducer according to the first to fourth embodiments described below is mainly configured of a piezoelectric element and a film body. In some of the regions, regions having different total film thicknesses (for example, a first region having a first total film thickness and a second region having a second total film thickness, etc.) are formed by adjusting a total film thickness that is the sum of a film thickness of the piezoelectric element and a film thickness of a vibration film of the film body, and such regions having different total film thicknesses (for example, the first region and the second region) are alternately arranged.

The transducer according to the first to fourth embodiments will be described with reference to the drawings.

First Embodiment

The configuration of the transducer 1 according to the first embodiment will be described with reference to FIGS. 1 and 2. The transducer 1 according to the first embodiment is mainly configured of a piezoelectric element 10 and a film body 15. In the following description, although the up-and-down direction is defined with reference to the state of the transducer 1 illustrated in FIG. 2, it does not mean that the direction in which the transducer 1 is used is limited.

The piezoelectric element 10 includes a pair of electrodes 11 and 12, a piezoelectric film 13 sandwiched between the pair of electrodes 11 and 12, and a plurality of buffer layers 18 on the pair of electrodes 11 and 12. The pair of electrodes 11 and 12 and the piezoelectric film 13 have a shape corresponding to the shape of a vibration film described later, and are square in the examples illustrated in FIGS. 1 and 2.

Although buffer layers are described as a part of the piezoelectric element in this specification, the configuration is not limited thereto. For example, it may be interpreted that buffer layers are not included as a part of the piezoelectric element.

The buffer layers 18 are formed in a stripe shape on the electrode 11. The buffer layers 18 are formed parallel to a connection portion 21 between a film support portion 17 and a vibration film 16, which will be described later. In the present specification, the term "parallel" refers to a state in which two straight lines are arranged at an angle of −5 degrees or more and 5 degrees or less, and also includes a state of two lines forming two circles included in concentric circles. Further, when the ends of the connection portion 21 and/or the buffer layers 18 are not straight, but for example, formed in a waveform shape or a zigzag shape, the buffer layers 18 may deviate slightly from parallel as long as the effect of the buffer layers 18, which will be described later, is not inhibited.

Figure 2:
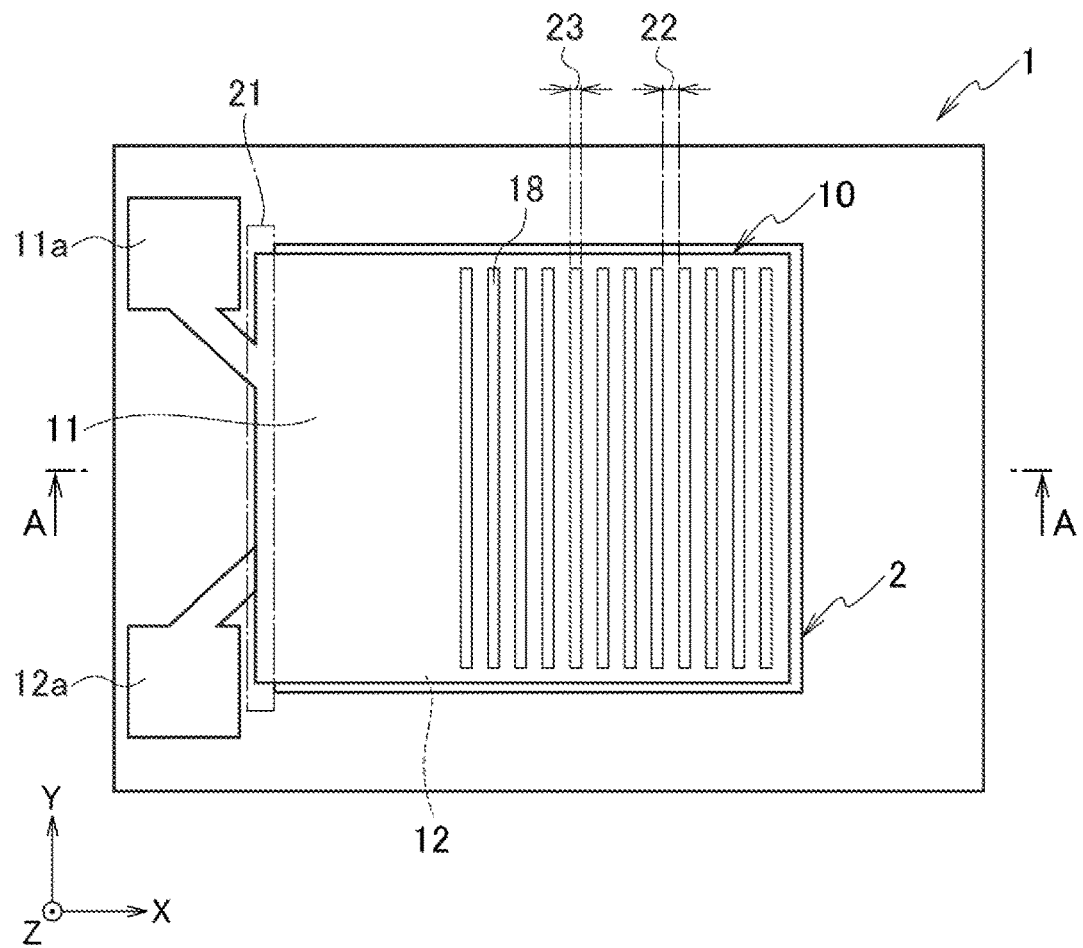
FIG. 2 is a top view of one mode of the transducer according to the first embodiment.

Further, although the ends of the buffer layers 18 illustrated in FIG. 2 are positioned inside the ends of the electrode 11, such ends may be aligned with the ends of the electrode 11.

The buffer layers 18 may be formed, for example, in the same process as the wiring layer (not illustrated) and/or the insulating layer (not illustrated) formed in manufacturing the transducer, or may be formed using a hard material such as titanium. The use of such a hard material increases the bending strength of the buffer layers, and suppresses the warpage of the piezoelectric film 13 (and the vibration film 16) in the direction parallel to the connection portion 21. The width and thickness of the buffer layers 18, and the pitch width between the adjacent buffer layers 18 are not particularly limited.

Each of the pair of electrodes 11 and 12 is formed using a thin film of a metal having conductivity, such as platinum, molybdenum, iridium, or titanium. One electrode 11 is positioned above the piezoelectric film 13, and is connected to an electrode pad 11a which is a circuit pattern for applying a driving voltage to the electrode 11. The other electrode 12 is positioned below the piezoelectric film 13, and is connected to an electrode pad 12a which is a circuit pattern for applying a driving voltage to the electrode 12.

The piezoelectric film 13 is made of, for example, lead zirconate titanate (PZT) film. The piezoelectric film 13 may be made of aluminum nitride (AlN), zinc oxide (ZnO), lead titanate ($PbTiO_3$), or the like, in addition to lead zirconate titanate.

The film body 15 includes the vibration film 16 and the film support portion 17. The film body 15 is made of, for example, silicon (Si). The vibration film 16 and the film support portion 17 are integrally formed by etching the back surface side of the film body 15.

The vibration film 16 is made of a thin film, and is configured to be displaceable in the film thickness direction, that is, in the direction normal to the vibration film 16 (the up-and-down direction in the page space of FIG. 1: Z direction, and the direction perpendicular to the plane of FIG. 2: Z direction). The vibration film 16 has a substantially square shape when observed from a plane parallel to the vibration film 16.

The film support portion 17 has a rectangular cylindrical inner peripheral surface forming a cavity (hollow portion) 20. The vibration film 16 is inscribed on one side of the inner peripheral surface of the film support portion 17, and thus the vibration film 16 is supported by the film support portion 17. The vibration film 16 is connected to the upper end side of the film support portion 17.

The transducer 1 includes a slit 2. The slit 2 is a notch penetrating a vibration body in the thickness direction in which the piezoelectric element 10 and the vibration film 16 are stacked.

The vibration film 16 has a cantilever shape protruding from the film support portion 17. The distal end of the vibration film 16 is formed at a free end. In addition, the vibration film 16 may have a double-sided beam shape with both ends fixed by the film support portion 17.

In regions overlapping a hollow portion 20, when the regions not including the buffer layers 18 are defined as first regions 22, and when the regions including the buffer layers 18 are defined as second regions 23, the first regions 22 and the second regions 23 are alternately arranged. One of the first regions 22 is adjacent to the connection portion 21. Further, the first total film thickness, which is the sum of the film thickness of the vibration film 16 and the film thickness of the piezoelectric element 10 not including the buffer layers 18 in the first region 22, differs from the second total film thickness, which is the sum of the film thickness of the vibration film 16 and the film thickness of the piezoelectric element 10 including the buffer layers 18 in the second region 23. That is, the first total film thickness differs from the second total film thickness by the film thickness of the buffer layers 18.

In the transducer 1 having such a configuration, the piezoelectric element 10 is provided on the vibration film 16 of the film body 15. That is, the lower electrode 12, the piezoelectric film 13, and the upper electrode 11 are stacked in this order on the vibration film 16. When a driving voltage is applied to the pair of electrodes 11 and 12, a potential difference is generated between the pair of electrodes 11 and 12. The vibration film 16 is displaced by this potential difference. Specifically, the distal end side of the vibration film 16 is displaced so as to be warped.

By repeatedly applying a driving voltage to the pair of electrodes 11 and 12, the vibration film 16 alternately repeats upward displacement and downward displacement. The air around the vibration film 16 is vibrated by the vibration of the vibration film 16, and the vibration of the air is outputted as a sound wave.

By providing the buffer layers 18 as described above, the stress of the piezoelectric film 13 in a direction parallel to the connection portion 21 is alleviated by the buffer layers 18, and a distortion of the piezoelectric film 13 in this direction can be suppressed. Accordingly, generation of warpage in the vibration film 16 can be suppressed, and thus the vibration film 16 can be appropriately vibrated.

Figure 3:
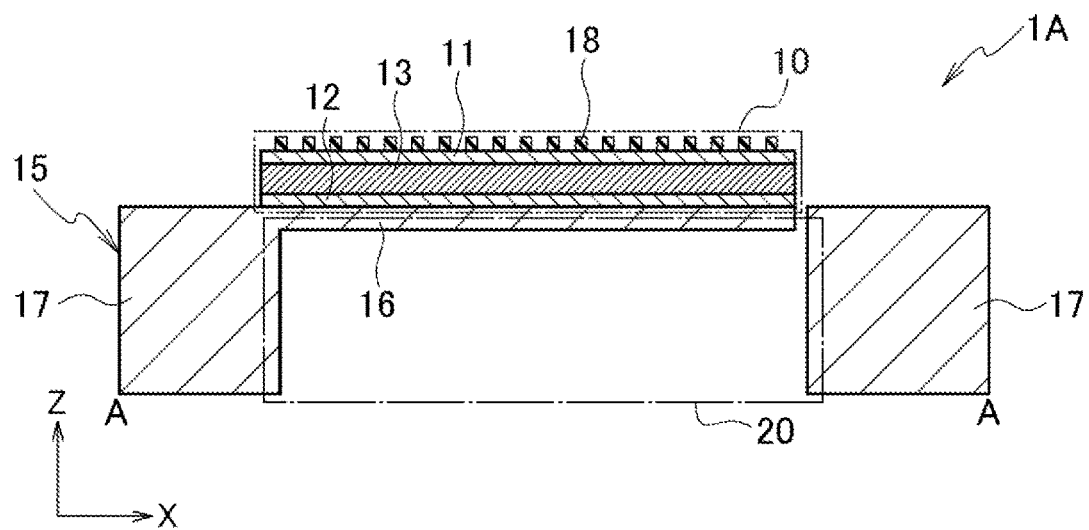
FIG. 3 is a cross-sectional view of another mode of the transducer according to the first embodiment.
Figure 4:
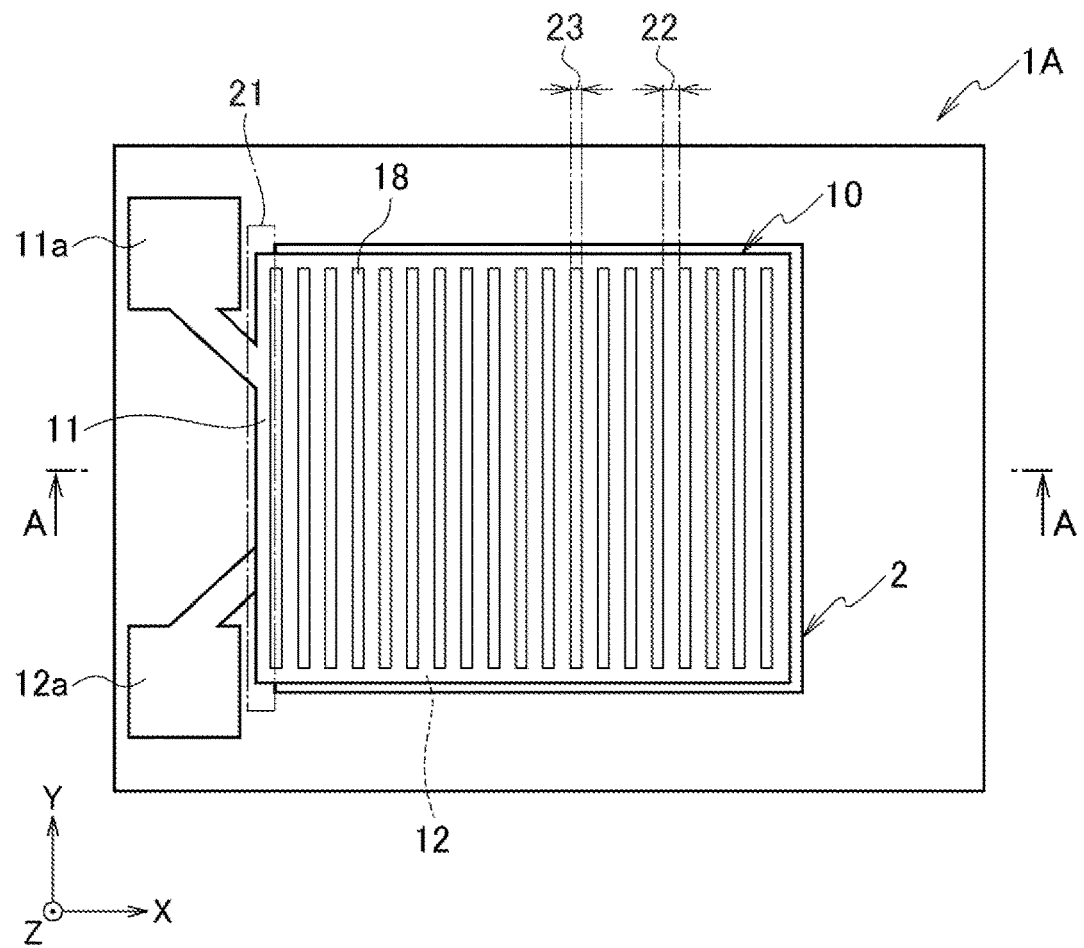
FIG. 4 is a top view of another mode of the transducer according to the first embodiment.

Further, in the present embodiment, as illustrated in FIG. 1, the buffer layers 18 are formed from the vicinity of the central portion of the vibration film 16 to the distal end thereof, but the configuration is not limited thereto. For example, as illustrated in FIGS. 3 and 4, the buffer layers 18 may be a transducer 1A formed from the vicinity of the connection portion 21 to the distal end thereof.

Second Embodiment

The configuration of a transducer 1B according to the second embodiment will be described with reference to FIGS. 5 and 6. The transducer 1B according to the second embodiment differs from the transducer 1 according to the first embodiment in that a vibration film having recesses is used instead of buffer layers. In the second embodiment, the matters common to those of the first embodiment are covered by the description of the first embodiment, and the matters different from those of the first embodiment will be described below in detail.

The film body 15 includes a vibration film 16a and the film support portion 17. The vibration film 16a has a plurality of recesses 19 on the back surface side. The vibration film 16a can be formed by etching the back surface side of the vibration film 16 of the first embodiment.

The vibration film 16a has a stripe shape in which the plurality of recesses 19 are arranged, and the recesses 19 are formed parallel to the connection portion 21. The width and depth of the recesses 19 and the pitch width between the adjacent recesses 19 are not particularly limited.

In regions overlapping the hollow portion 20, the first regions 24 and the second regions 25 are alternately arranged when the regions not including the recesses 19 are defined as the first regions 24, and the regions including the recesses 19 are defined as the second region 25. One of the first regions 24 is adjacent to the connection portion 21. Further, the first total film thickness, which is the sum of the film thickness of the vibration film 16a and the film thickness of the piezoelectric element 10 in the first region 24 not including the recesses 19, differs from the second total film thickness, which is the sum of the film thickness of the vibration film 16a and the film thickness of the piezoelectric element 10 in the second region 25 including the recesses 19. That is, the first total film thickness differs from the second total film thickness by the depth of the recesses 19.

By providing the recesses 19 as described above, the stress of the piezoelectric film 13 in a direction parallel to the connection portion 21 is alleviated by the recesses 19, and the warpage of the piezoelectric film 13 in this direction can be suppressed. Accordingly, generation of distortion in the vibration film 16a can be suppressed, and thus the vibration film 16a can be appropriately vibrated.

Figure 5:
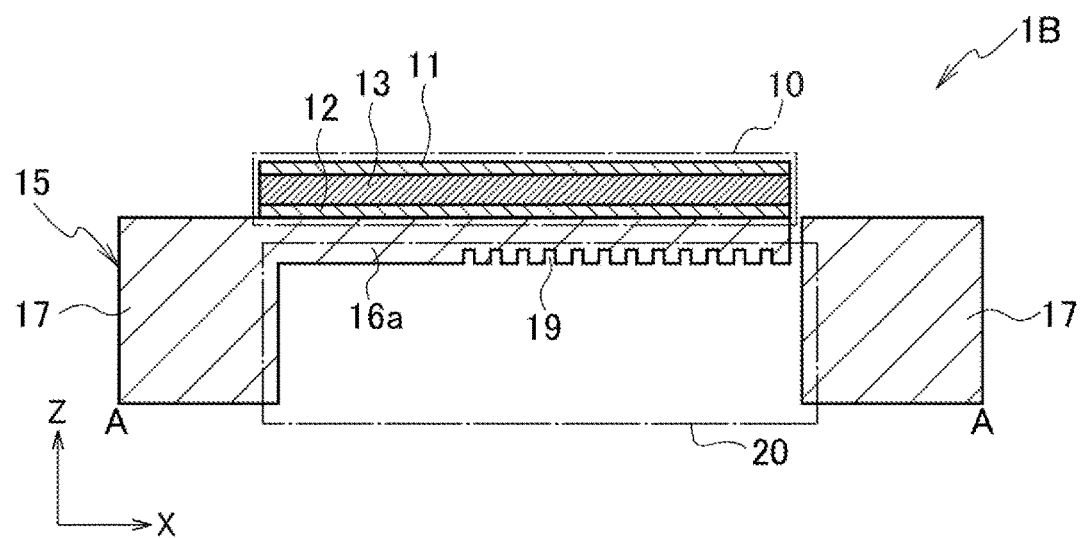
FIG. 5 is a cross-sectional view of one mode of a transducer according to a second embodiment.
Figure 6:
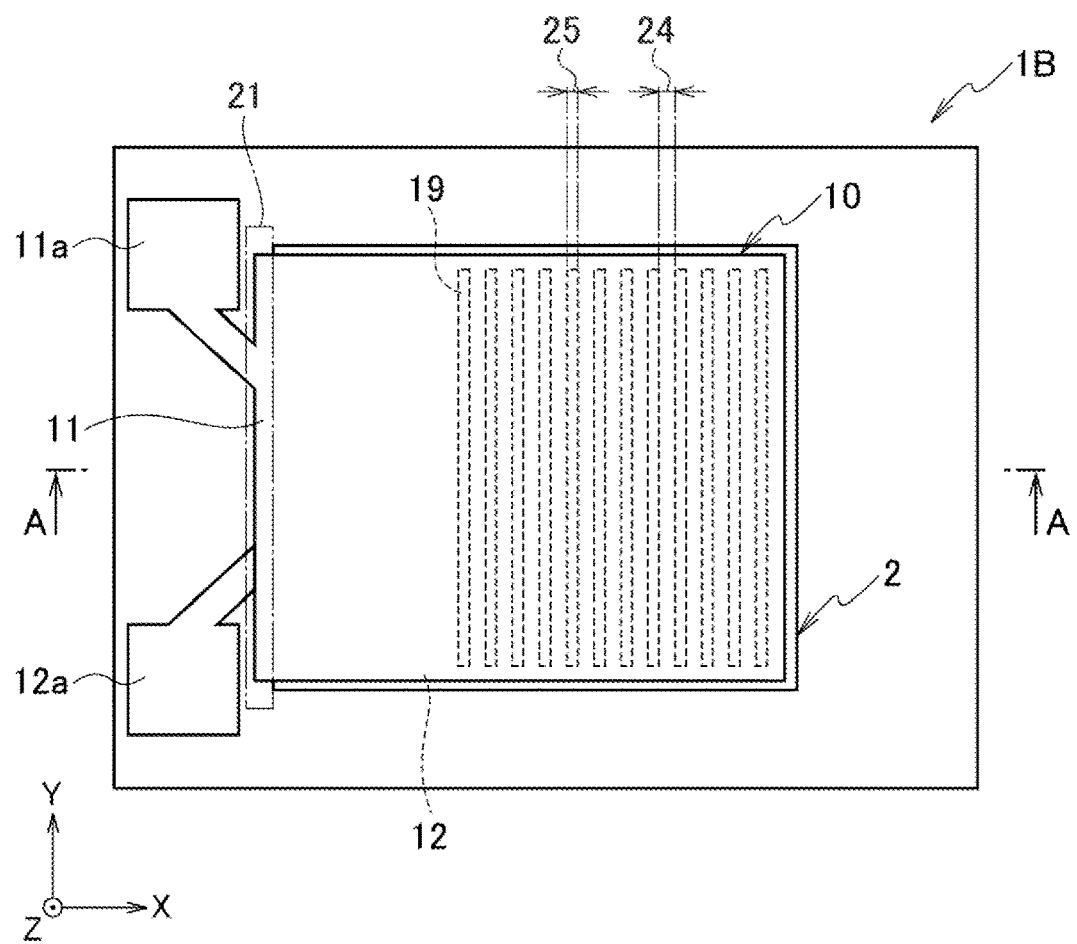
FIG. 6 is a top view of one mode of the transducer according to the second embodiment.

In the second embodiment, as illustrated in FIG. 5, the recesses 19 are arranged from the vicinity of the central portion of the vibration film 16a to the distal end thereof, but the configuration is not limited thereto. For example, the recesses 19 may be arranged from the vicinity of the connection portion 21 to the distal end thereof.

Third Embodiment

The configuration of a transducer 1C according to the present embodiment will be described with reference to FIGS. 7 and 8. The transducer 1C according to the third embodiment differs from the transducer 1 according to the first embodiment in that the piezoelectric element 10 has piezoelectric slits 14. In the third embodiment, the matters common to those of the first embodiment are covered by the description of the first embodiment, and the matters different from those of the first embodiment will be described below in detail.

The piezoelectric element 10 has the piezoelectric slits 14 penetrating the piezoelectric element 10 in the thickness direction. The piezoelectric slits 14 extend to the slit 2 along the direction perpendicular to the connection portion 21. In this specification, the term "perpendicular" refers to a state in which two straight lines are arranged at an angle of 85 degrees or more to 95 degrees or less. Further, as long as the effect of the piezoelectric slits 14, which will be described later, is not inhibited, the piezoelectric slits 14 may deviate slightly from perpendicular.

Since the vibration film 16 is divided by the piezoelectric slits 14 in a direction parallel to the connection portion 21, a distortion of the piezoelectric film 13 in this direction can be suppressed. Accordingly, generation of warpage in the vibration film 16 can be suppressed, and thus the vibration film 16 can be appropriately vibrated.

By further providing the piezoelectric slits 14 in addition to the buffer layers 18, the warpage of the piezoelectric film 13 in the vibration film 16 can be further suppressed.

Figure 7:
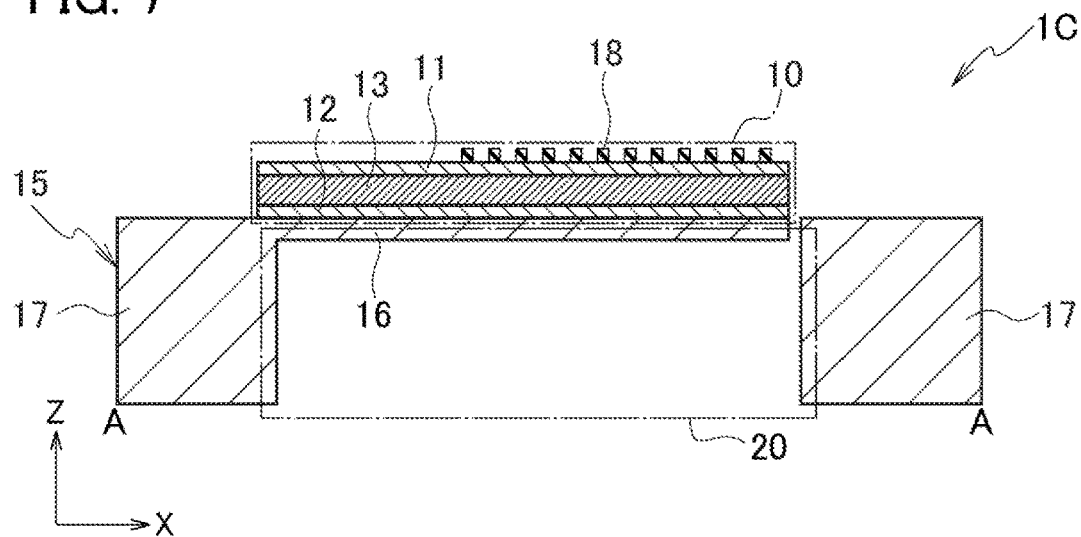
FIG. 7 is a cross-sectional view of one mode of a transducer according to a third embodiment.
Figure 8:
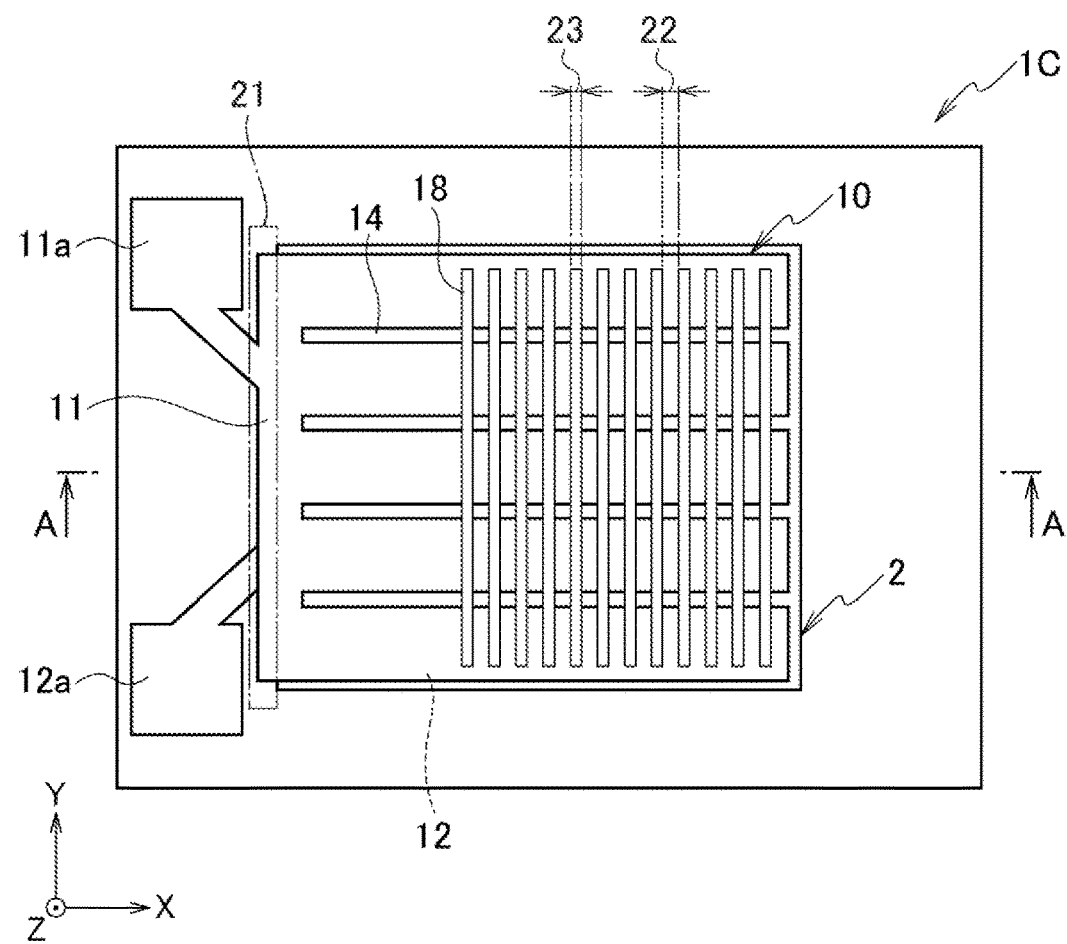
FIG. 8 is a top view of one mode of the transducer according to the third embodiment.

Further, although the buffer layers 18 illustrated in FIG. 7 are provided so as to straddle the piezoelectric slits 14, the configuration is not limited thereto. For example, the buffer layers 18 may be divided by the piezoelectric slits 14.

Fourth Embodiment

The shape and pitch width of the buffer layers (or recesses) of the transducer according to the above-described embodiments may be suitably changed as follows, for example.

Figure 9:
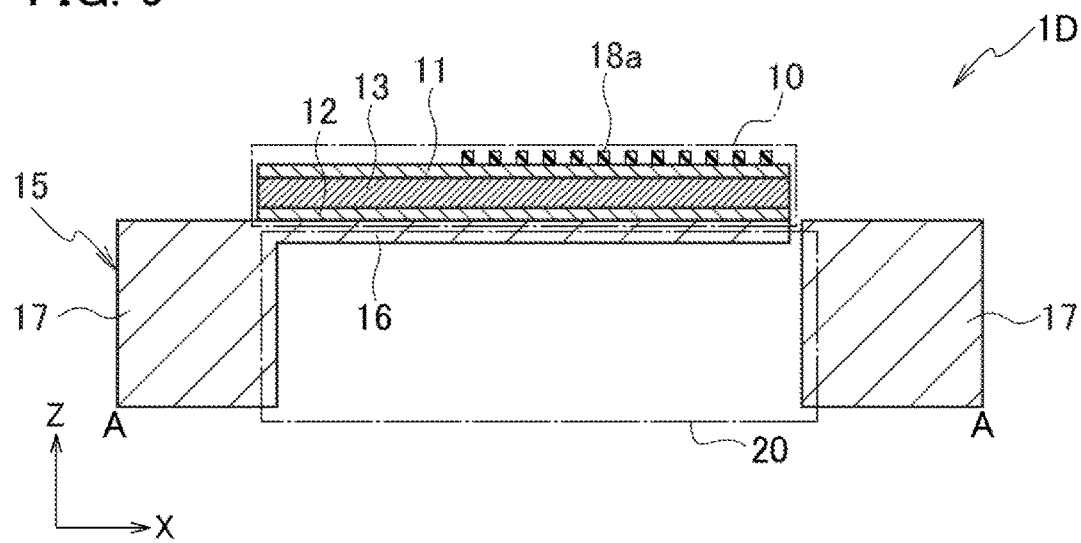
FIG. 9 is a cross-sectional view of one mode of a transducer according to a fourth embodiment.
Figure 10:
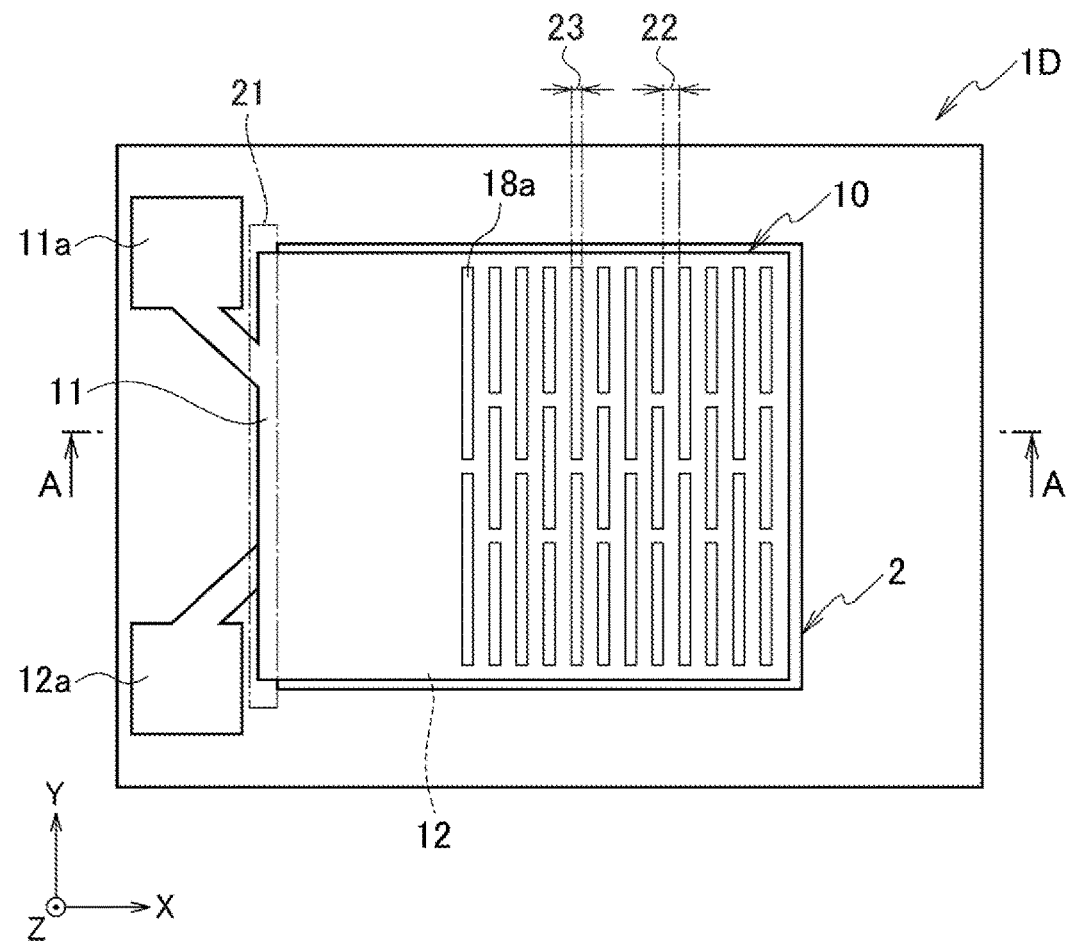
FIG. 10 is a top view of one mode of the transducer according to the fourth embodiment.
Figure 11:
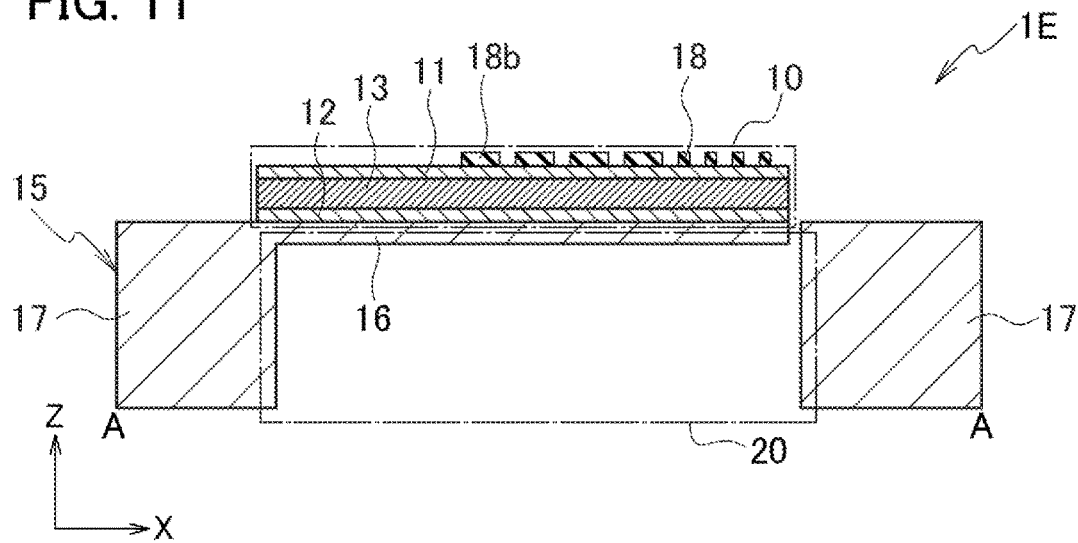
FIG. 11 is a cross-sectional view of another mode of the transducer according to the fourth embodiment.
Figure 12:
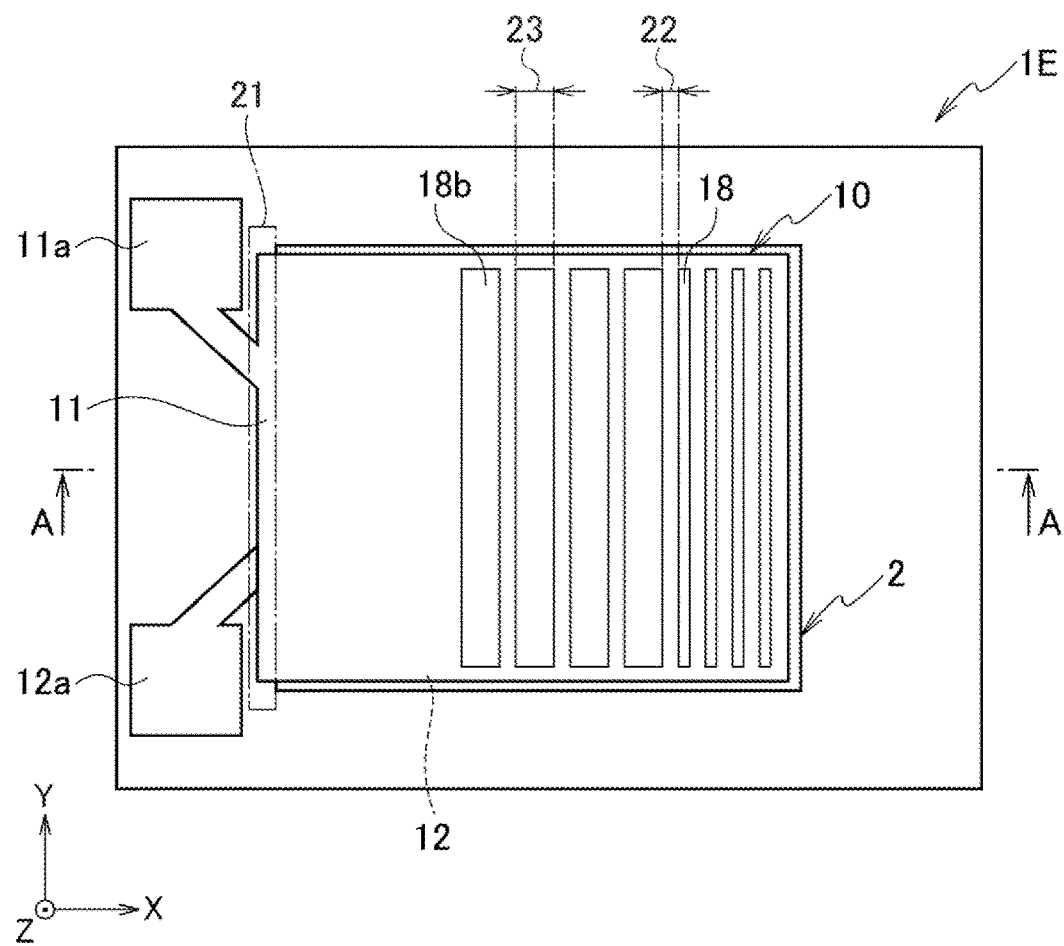
FIG. 12 is a top view of another mode of the transducer according to the fourth embodiment.
Figure 13:
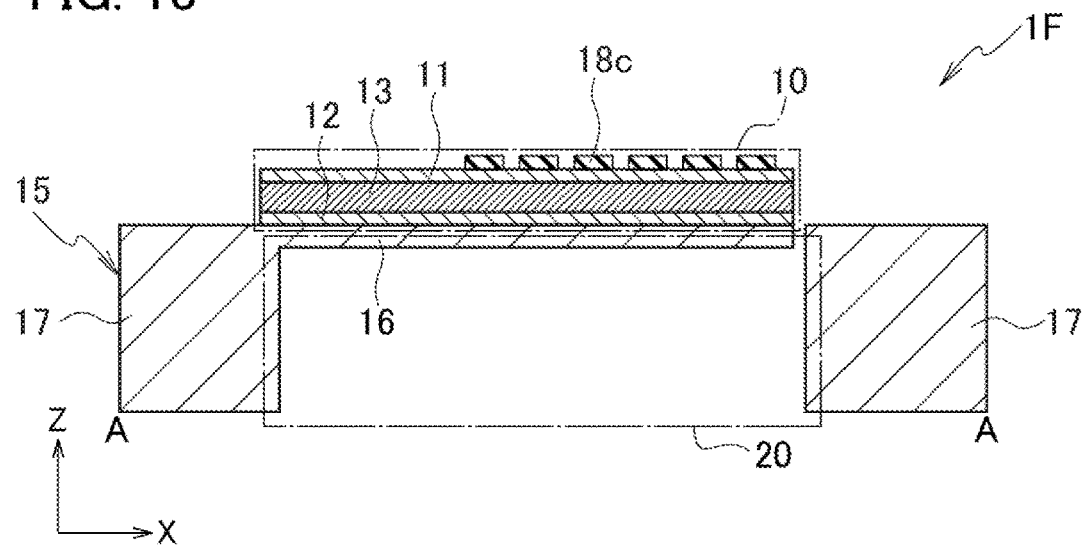
FIG. 13 is a cross-sectional view of another mode of the transducer according to the fourth embodiment.
Figure 14:
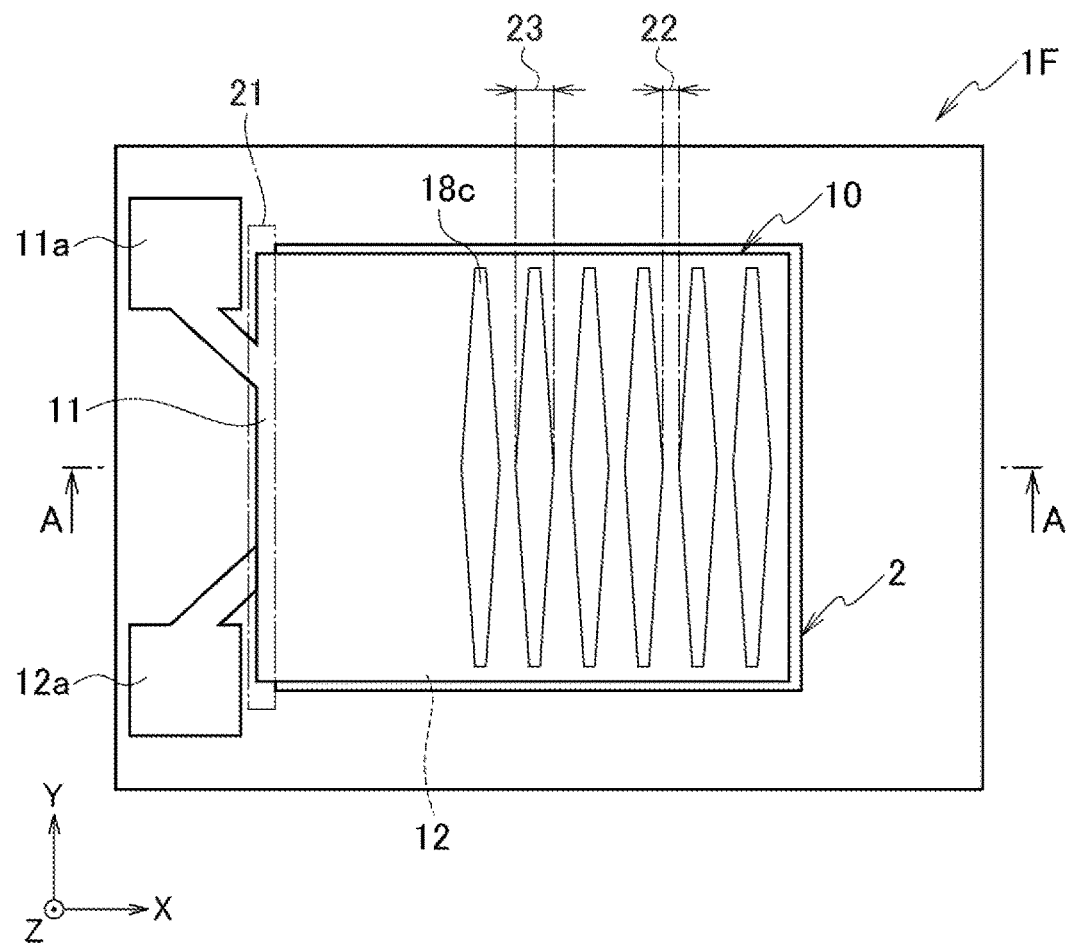
FIG. 14 is a top view of another mode of the transducer according to the fourth embodiment.

For example, as in a transducer 1D illustrated in FIGS. 9 and 10, the divided buffer layers 18a may be arranged on the electrode 11, or as in a transducer 1E illustrated in FIGS. 11 and 12, the width of the buffer layers 18b close to the connection portion 21 may be larger than the width of the buffer layers 18 provided farther than the buffer layers 18b from the connection portion 21. Further, as in a transducer 1F illustrated in FIGS. 13 and 14, buffer layers 18c may be arranged on the electrode 11. The buffer layers 18c increase in width toward the central portion in the longitudinal direction.

Figure 15:
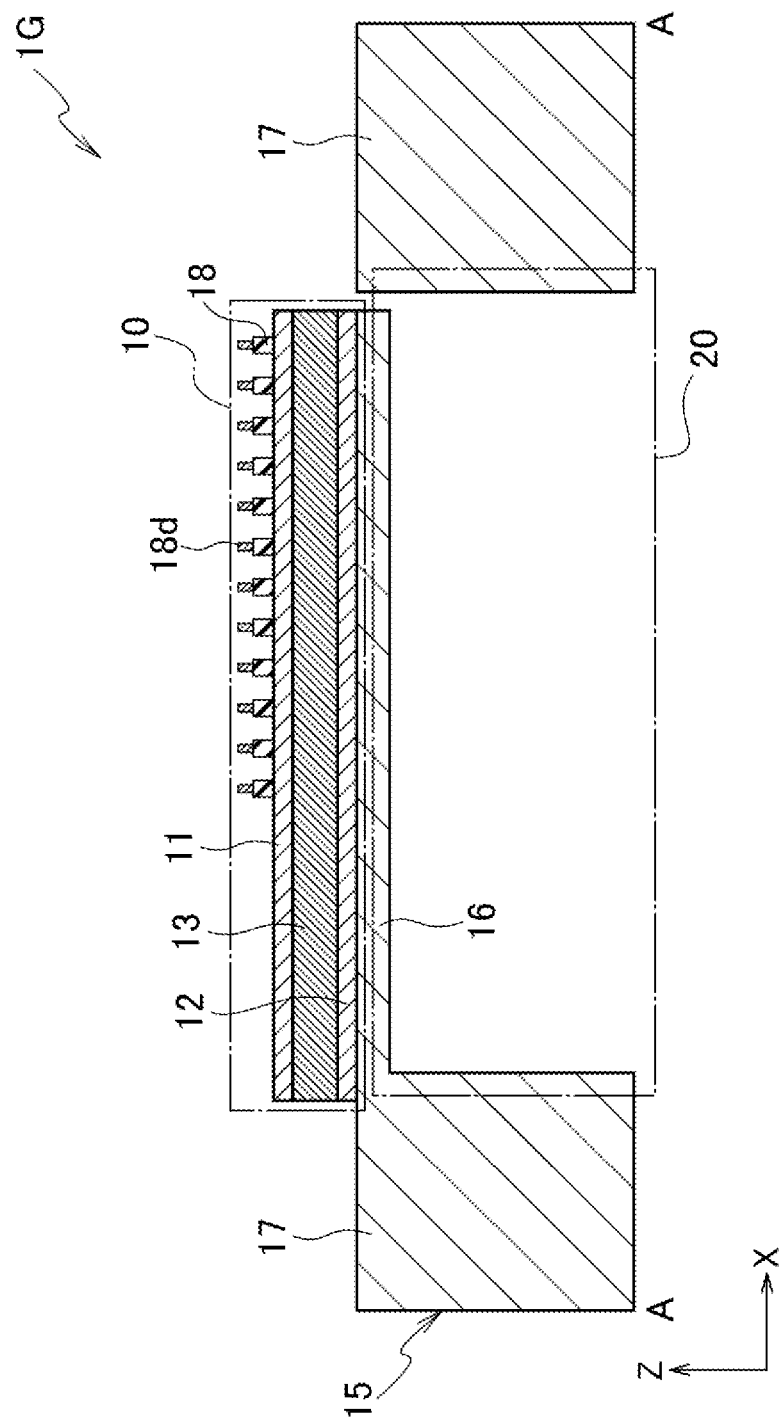
FIG. 15 is a cross-sectional view of another mode of the transducer according to the fourth embodiment.
Figure 16:
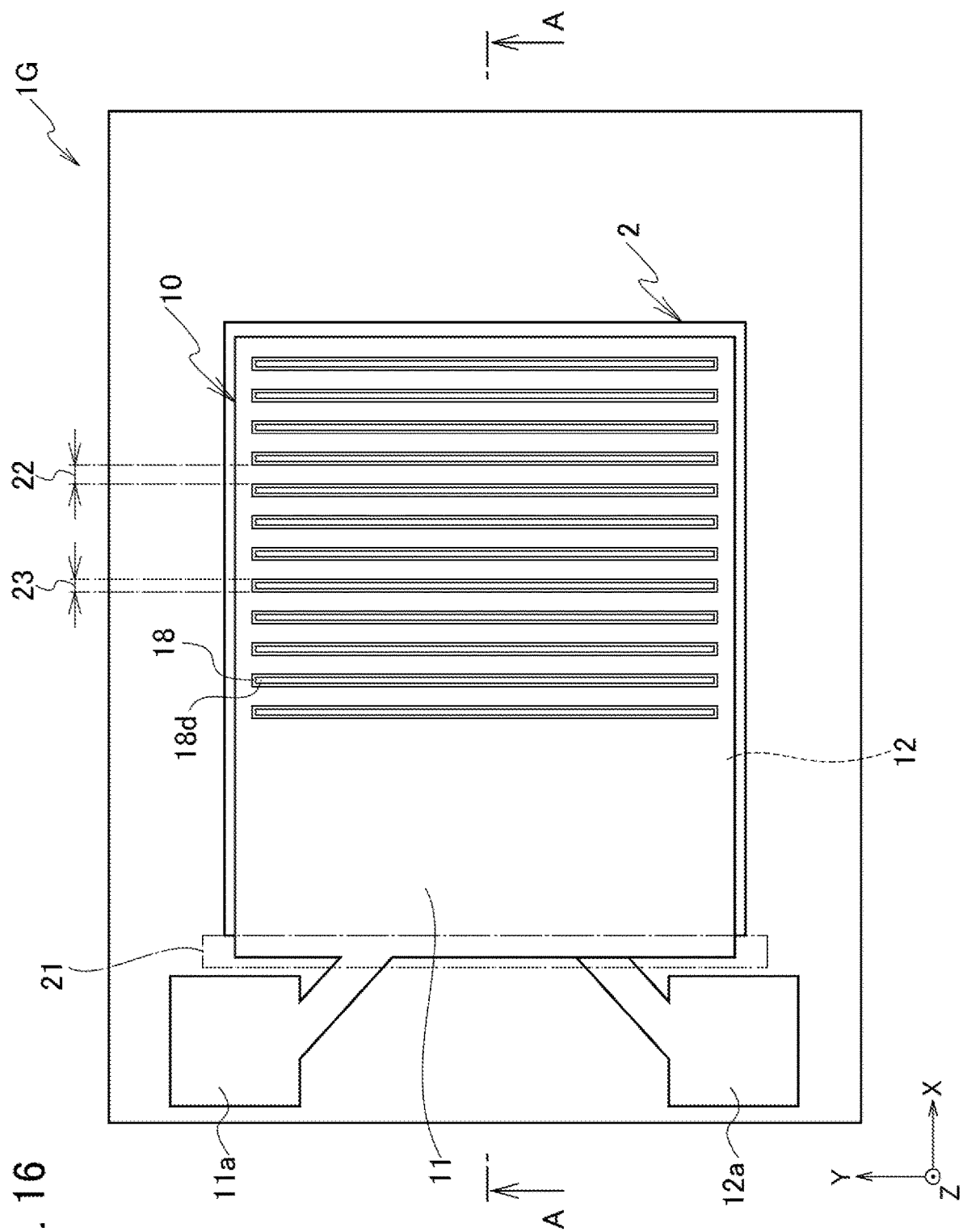
FIG. 16 is a top view of another mode of the transducer according to the fourth embodiment.
Figure 17:
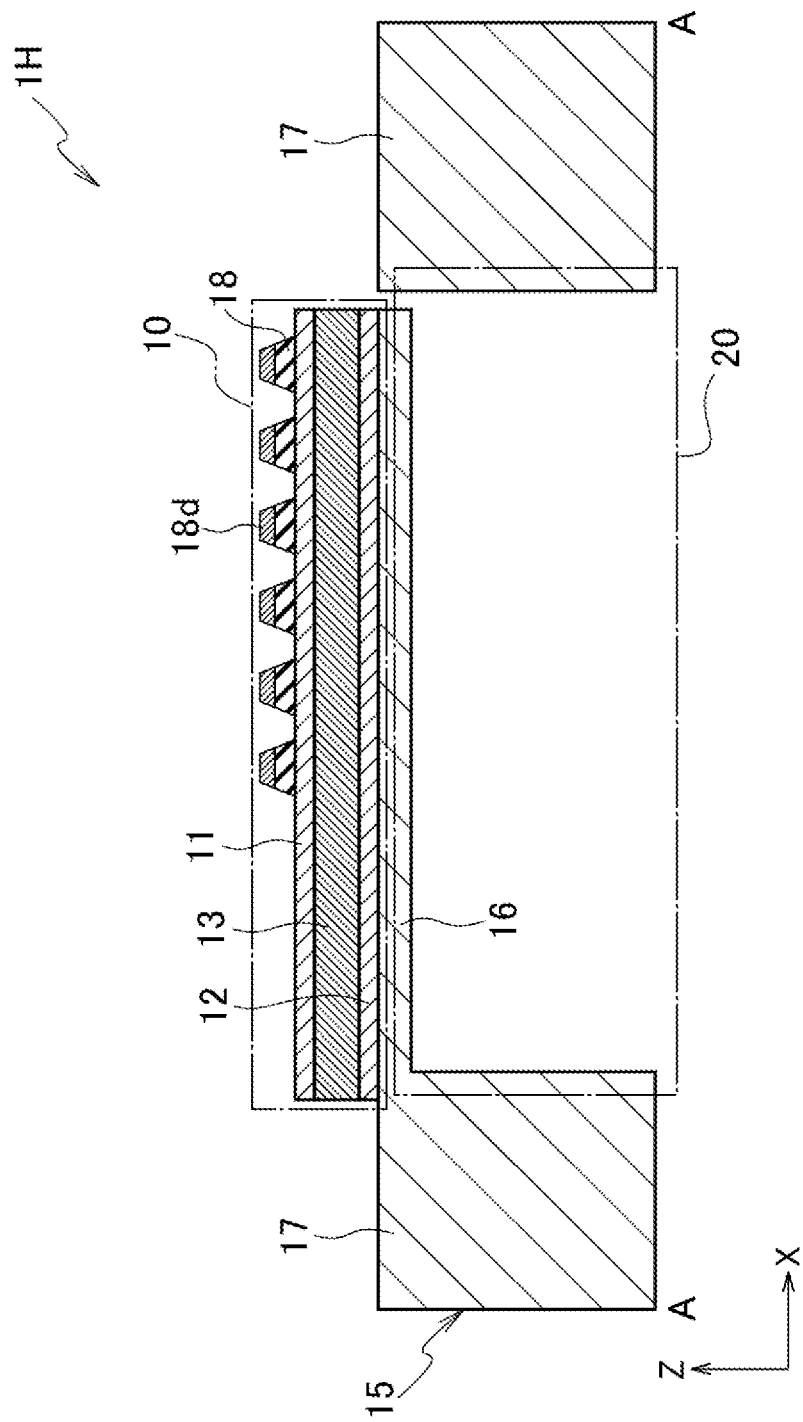
FIG. 17 is a cross-sectional view of another mode of the transducer according to the fourth embodiment.
Figure 18:
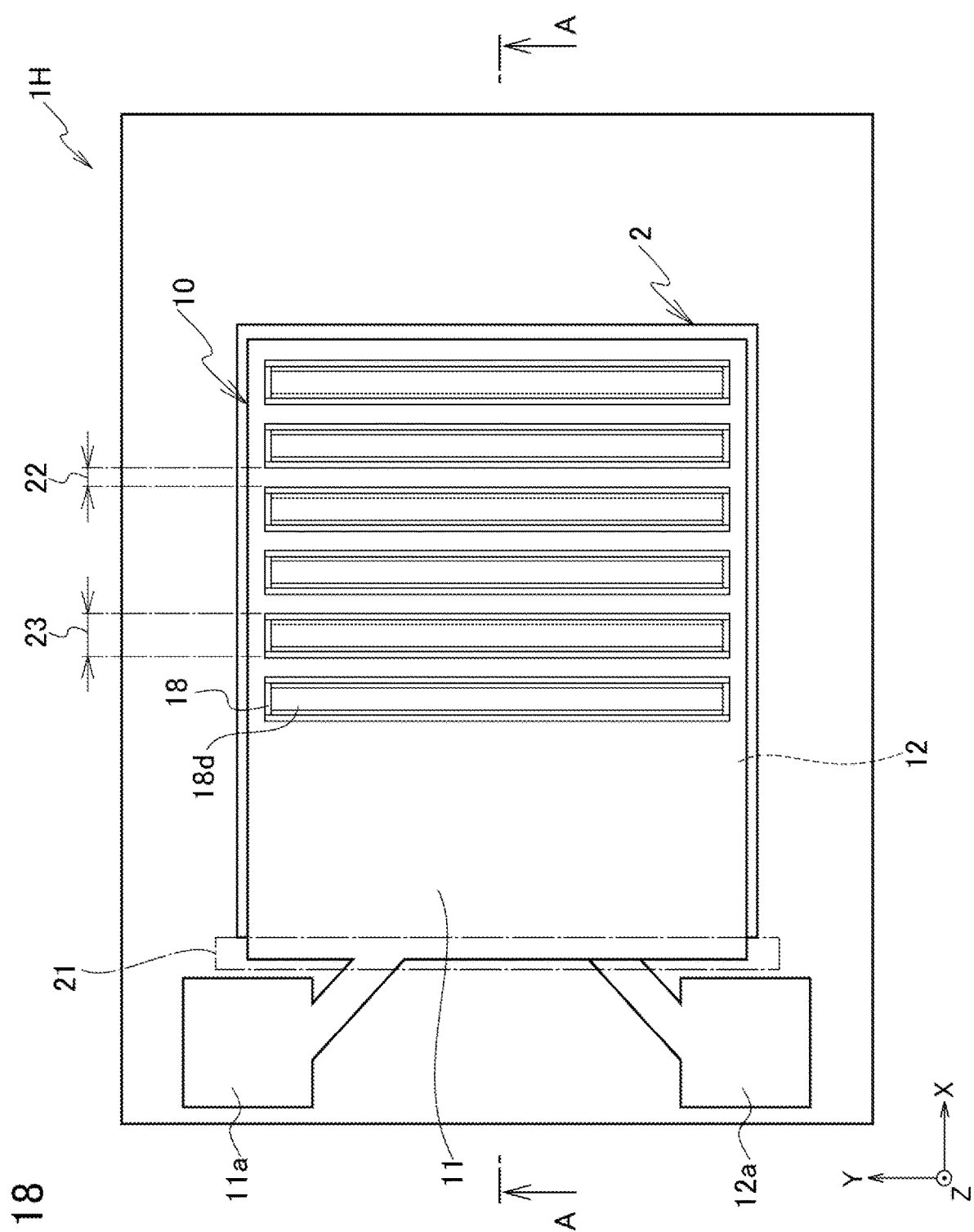
FIG. 18 is a top view of another mode of the transducer according to the fourth embodiment.
Figure 19:
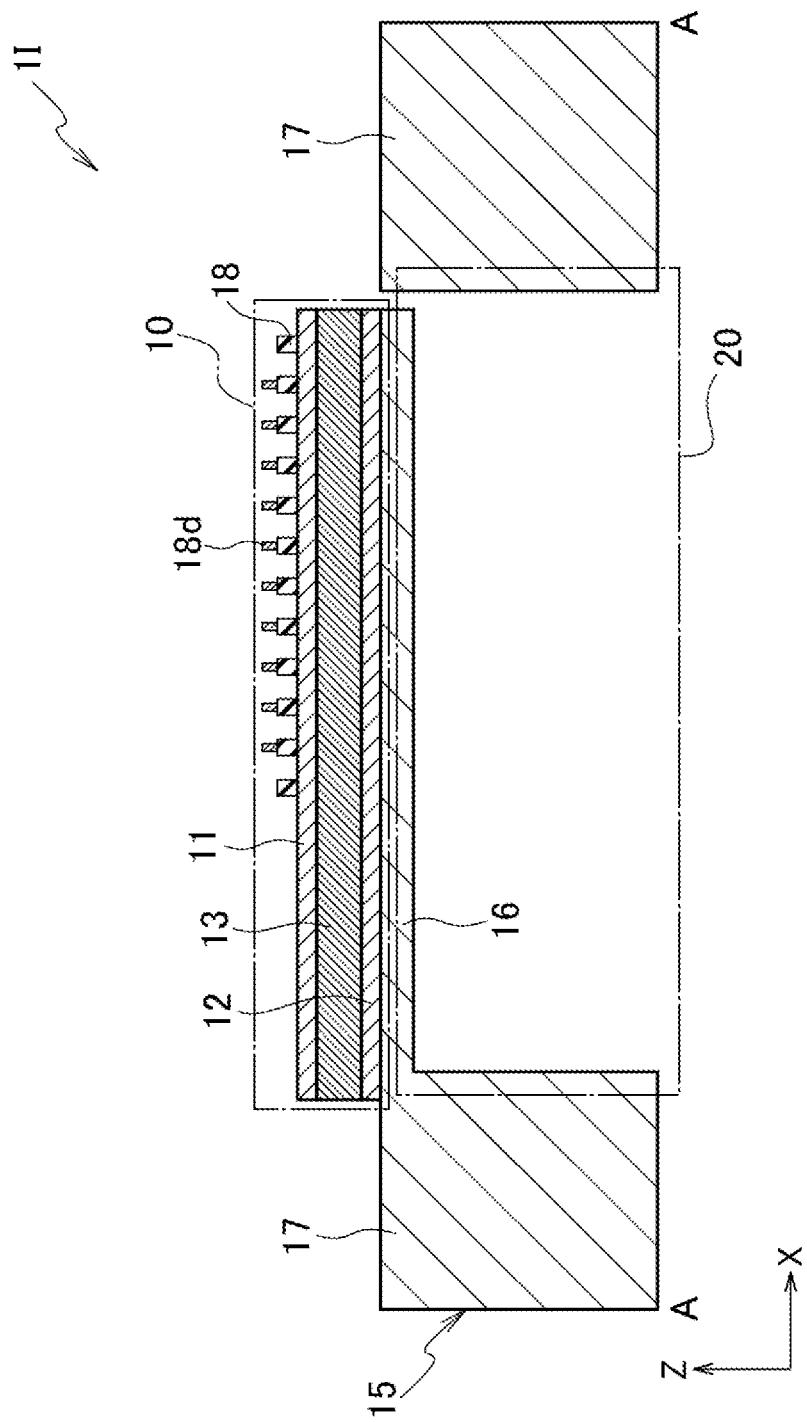
FIG. 19 is a cross-sectional view of another mode of the transducer according to the fourth embodiment.
Figure 20:
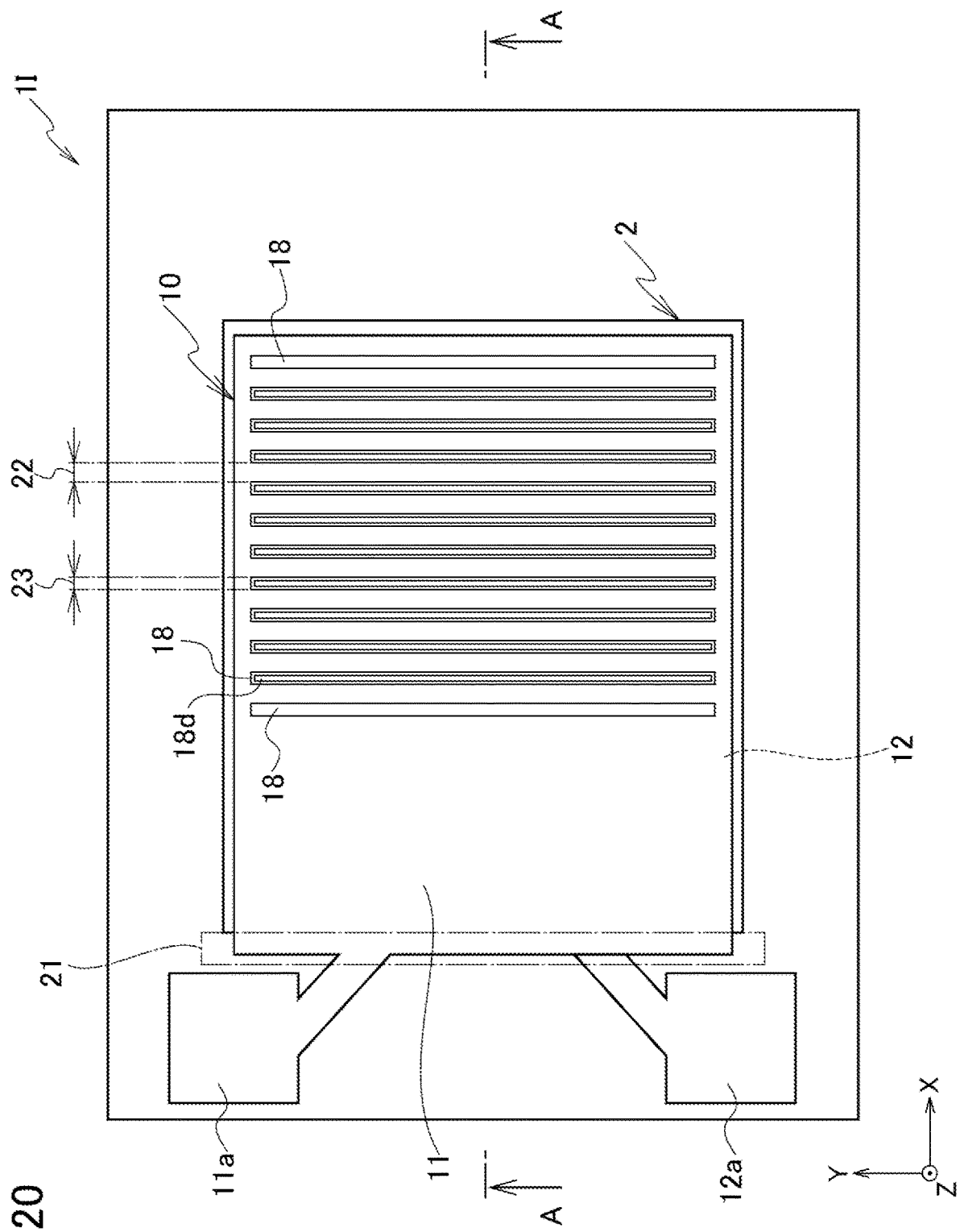
FIG. 20 is a top view of another mode of the transducer according to the fourth embodiment.

The buffer layers may be composed of two or more layers made of the same or different materials, for example, the buffer layers 18d may be further provided on the buffer layers 18 as in a transducer 1G illustrated in FIGS. 15 and 16, or the buffer layers 18 and the buffer layers 18d may have a tapered shape as in a transducer 1H illustrated in FIGS. 17 and 18. Further, as in a transducer 1I illustrated in FIGS. 19 and 20, the buffer layers 18d may be provided on some of the plurality of buffer layers 18. For example, a quantity of layers including the buffer layers close to the connection portion 21 may be different from a quantity of layers including the buffer layers far from the connection portion 21.

When a hard material is used for the buffer layers, the hard material may inhibit the contraction of the piezoelectric film 13 in the direction perpendicular to the connection portion 21, and thus the efficiency of the air vibration may be reduced. Accordingly, it is preferable that a lower layer formed of a hard material is provided with a layer formed of soft material. The soft material may be, for example, an insulating layer such as silicon oxide or a resin, and the buffer layers 18a illustrated in FIGS. 9 and 10 may be provided with silicon oxide as a soft material, and the buffer layers 18d may be provided with titanium as a hard material.

Further, in the recesses 19 of the second embodiment (although not illustrated), for example, the widths of the recesses close to the connection portion 21 may be larger than the widths of the recesses provided farther from the connection portion 21. In addition, recesses whose width increases toward the central portion in the longitudinal direction may be provided. Recesses having different depths may also be provided.

Fifth Embodiment

The configuration of a transducer 101 according to the fifth embodiment will be described with reference to FIGS. 21 and 22. The transducer 101 according to the fifth embodiment is mainly configured of a piezoelectric element 110, a film body 115, an abutment member 118, and a substrate 119. In the following description, although the up-and-down direction is defined with reference to the state of the transducer 101 illustrated in FIG. 21, it does not mean that the direction in which the transducer 101 is used is limited.

The piezoelectric element 110 includes a pair of electrodes 111 and 112, and a piezoelectric film 113 sandwiched between the pair of electrodes 111 and 112. The pair of electrodes 111 and 112 and the piezoelectric film 113 have a shape corresponding to the shape of a vibration film 116 described later, and are square in the examples illustrated in FIGS. 21 and 22.

The abutment member 118 is arranged so as to face the vibration film 116. The abutment member 118 has a function to control the displacement of the vibration film 116. That is, when the vibration film 116 is displaced to the space 200 side, the abutment member 118 controls the displacement of the vibration film 116 by the vibration film 116 or the piezoelectric element 110 arranged on the vibration film 116 coming into contact with the abutment member 118.

The distance between the abutment surface of the abutment member 118 which the vibration film 116 abuts and the vibration film 116 is set based on the displacement of the vibration film 116 when a rated voltage is applied to the piezoelectric element 110 (hereinafter referred to as "maximum displacement"). That is, the abutment surface of the abutment member 118 is set such that the vibration film 116 or the piezoelectric element 110 (these elements are also called a vibration body when stacked) abuts the abutment surface when a displacement larger than the maximum displacement is generated. Accordingly, the vibration film 116 or the piezoelectric element 110 abuts the abutment surface when a large displacement exceeding the maximum displacement is generated in the vibration body by impact or the like without disturbing the normal displacement of the vibration film 116 due to the piezoelectric element 110.

The shape of the abutment surface is formed based on the displacement shape when the vibration film 116 is displaced. Thus, when the vibration film 116 abuts the abutment surface, the abutment surface abuts the vibration film 116 with the surface. For example, the abutment surface of the abutment member arranged in the space 200 may have a hemispherical shape curved upward.

An opening 118a is formed in the center of the abutment member 118. In the space 200 between the vibration film 116 and the abutment member 118, air vibrates due to the displacement of the vibration film 116, and the air flows to the outside of the transducer 101 through the opening 118a. When the air flows in the space 200, the distance (clearance) between the vibration film 116 and the abutment surface of the abutment member 118 may be as long as the vibration film 116 can be displaced up and down, and is preferably small. For example, the clearance is 5 to 30 µm. By reducing the clearance, an air leakage can be suppressed, and thus air can be efficiently vibrated. As illustrated in FIG. 22, the opening 118a preferably has rounded ends. Since the ends of the opening 118a are rounded, the concentration of stress at the ends can be alleviated.

Each of the pair of electrodes 111 and 112 is formed using a thin film of a metal having conductivity, such as platinum, molybdenum, iridium, or titanium. One electrode 111 is positioned above the piezoelectric film 113, and is connected to an electrode pad which is a circuit pattern for applying a driving voltage to the electrode 111. The other electrode 112 is positioned below the piezoelectric film 113, and is connected to an electrode pad which is a circuit pattern for applying a driving voltage to the electrode 112.

The piezoelectric film 113 is made of, for example, lead zirconate titanate (PZT). The piezoelectric film 113, may be made of aluminum nitride (AlN), zinc oxide (ZnO), lead titanate ($PbTiO_3$), or the like, in addition to lead zirconate titanate.

The electrode 111 is connected to wiring 121 through an opening provided in an insulating film 120. An insulating film 122 is provided on the wiring 121. The electrode 111 is electrically connected to the electrode pad through an opening of the insulating film 122. The abutment member 118 is formed on the insulating film 122 and the film support portion 117. In the present specification, the term "electrically connected" includes being connected through "something having an electrical action". Here, "something having an electrical action" is not particularly limited as long as it enables the transmission and reception of electrical signals between the connection objects. For example, "something having an electrical action" includes electrodes, wiring, switching elements, resistive elements, inductors, capacitive elements, and the other elements having various functions.

The wiring 121 is formed by using, for example, a thin film such as a metal. The insulating films 120 and 122 may be, for example, aluminum oxide.

The film body 115 includes a vibration film 116 and a film support portion 117. The film body 115 is made of, for example, silicon (Si). The vibration film 116 and the film support portion 117 are integrally formed by etching the back surface side of the film body 115.

Figure 21:
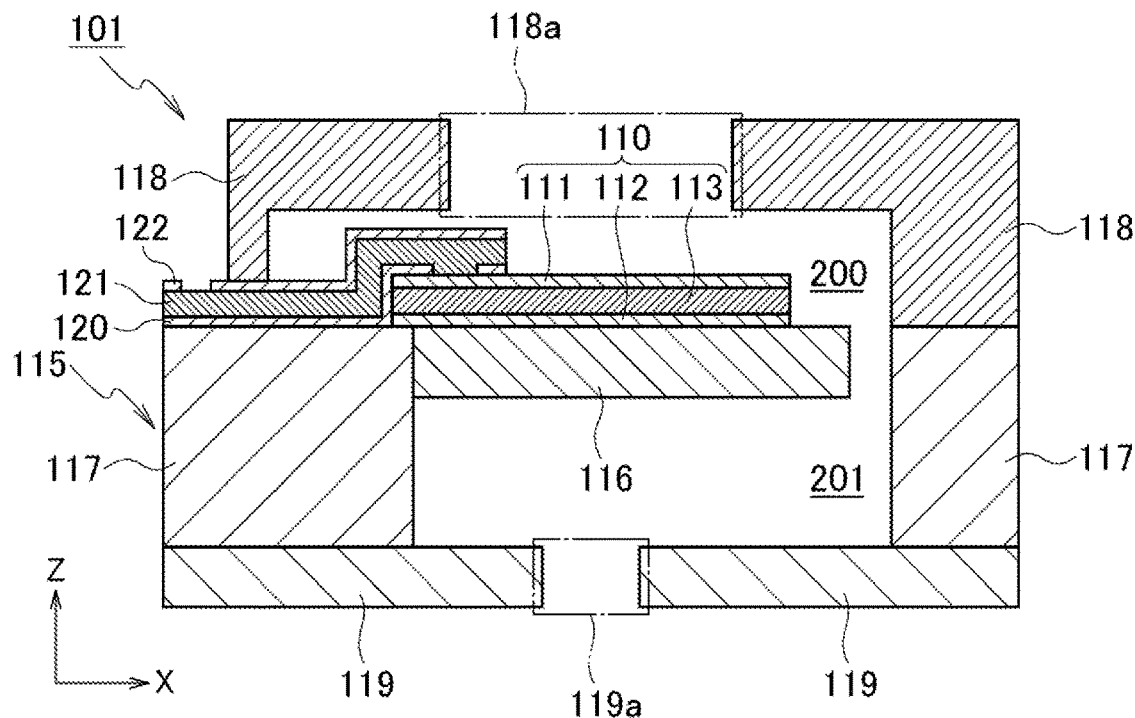
FIG. 21 is a cross-sectional view of a transducer according to a fifth embodiment.
Figure 22:
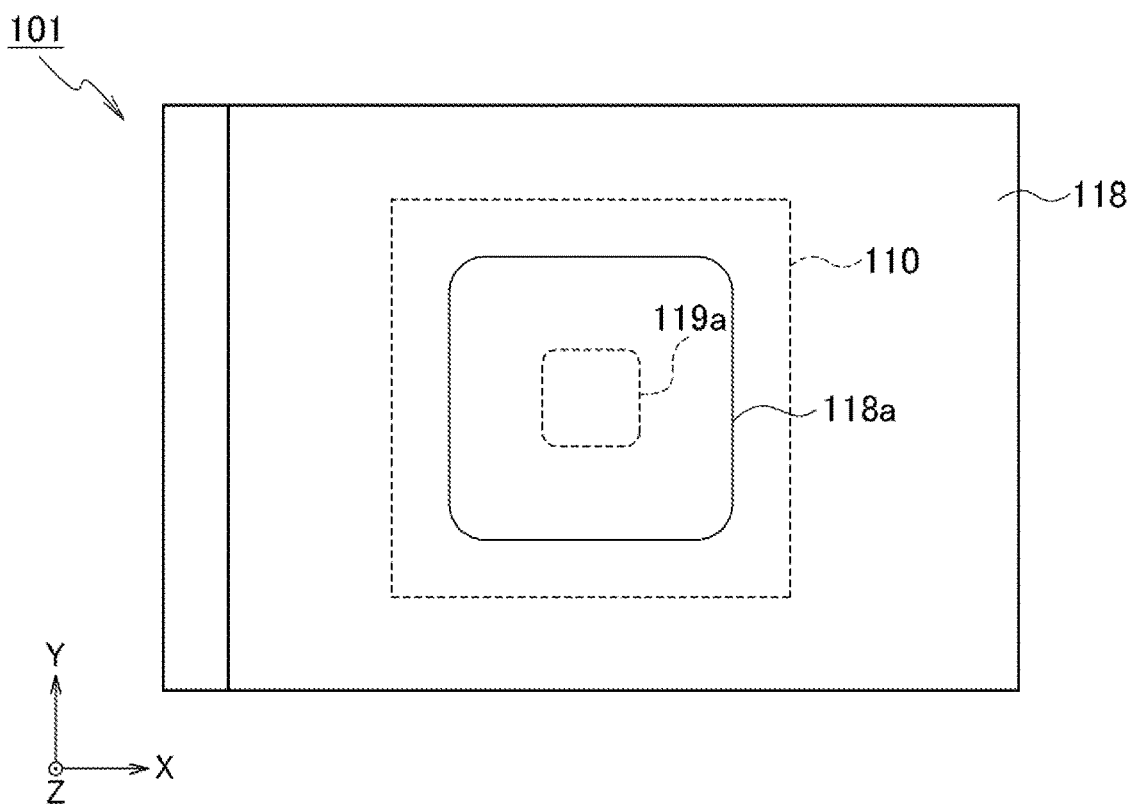
FIG. 22 is a top view of the transducer according to the fifth embodiment.

The vibration film 116 is made of a thin film, and is configured to be displaceable in the film thickness direction, that is, in the direction normal to the vibration film 116 (the up-and-down direction in the page space of FIG. 21: Z direction, and the direction perpendicular to the plane of FIG. 22: Z direction). The vibration film 116 has a substantially square shape when observed from a plane parallel to the vibration film 116.

The file support portion 117 has a rectangular cylindrical inner peripheral surface forming a space (hollow portion and cavity) 201. The vibration film 116 is inscribed on one side of the inner peripheral surface of the film support portion 117, and thus the vibration film 116 is supported by the film support portion 117. The vibration film 116 is connected to the upper end side of the film support portion 117.

The file support portion 117 includes a region overlapping the end of the piezoelectric element 110, and the vibration film 116 has a cantilever shape protruding from the file support portion 117. The distal end of the vibration film 116 is formed at a free end. In addition, the vibration film 116 may have a double-sided beam shape with both ends fixed by the film support portion 117.

The substrate 119 abuts the film support 117. An opening 119a is formed in the center of the substrate 119. In the space 201 surrounded by the vibration film 116, the film support portion 117 and the substrate 119, air vibrates due to the displacement of the vibration film 116, and the air flows to the outside of the transducer 101 through the opening 119a. As illustrated in FIG. 22, the opening 119a preferably has rounded ends. Since the ends of the opening 119a are rounded, the concentration of stress at the end can be alleviated. The substrate 119 is made of, for example, silicon (Si). The substrate 119 has a function to limit the displacement of the vibration film 116.

In the transducer 101 having such a configuration, the piezoelectric element 110 is provided on the vibration film 116 of the film body 115. That is, the lower electrode 112, the piezoelectric film 113, and the upper electrode 111 are stacked in this order on the vibration film 116. When a driving voltage is applied to the pair of electrodes 111 and 112, a potential difference is generated between the pair of electrodes 111 and 112. The vibration film 116 is displaced by this potential difference. Specifically, the distal end side of the vibration film 116 is displaced so as to be warped.

By repeatedly applying a driving voltage to the pair of electrodes 111 and 112, the vibration film 116 alternately repeats displacement to the space 200 side, and displacement to the space 201 side. The air around the vibration film 116 is vibrated by the vibration of the vibration film 116, and the vibration of the air is outputted as a sound wave.

In the fifth embodiment, the transducer 101 includes an abutment member 118 which limits the displacement of the vibration film 116 by bringing the vibration film 116 or the piezoelectric element 110 into contact with the abutment member 118 when the vibration film 116 is displaced in the film thickness direction. The substrate 119 also has a function to limit the displacement of the vibration film 116.

According to this structure, an air leakage can be suppressed by the abutment member 118 and/or the substrate 119, and thus air can be efficiently vibrated. Further, since the displacement of the vibration film 116 can be limited by the abutment member 118 and/or the substrate 119, an excessive displacement of the vibration film 116 due to impact or the like can be suppressed. This makes it possible to suppress the occurrence of breakage or the like, and thus it is possible to obtain the transducer which suppresses an air leakage and has resistance to impact or the like.

The transducer according to the fifth embodiment is not limited to the above-described structure, and the various modifications can be made. The modifications of the transducer according to the fifth embodiment will be described below.

<First Modification>

Figure 23:
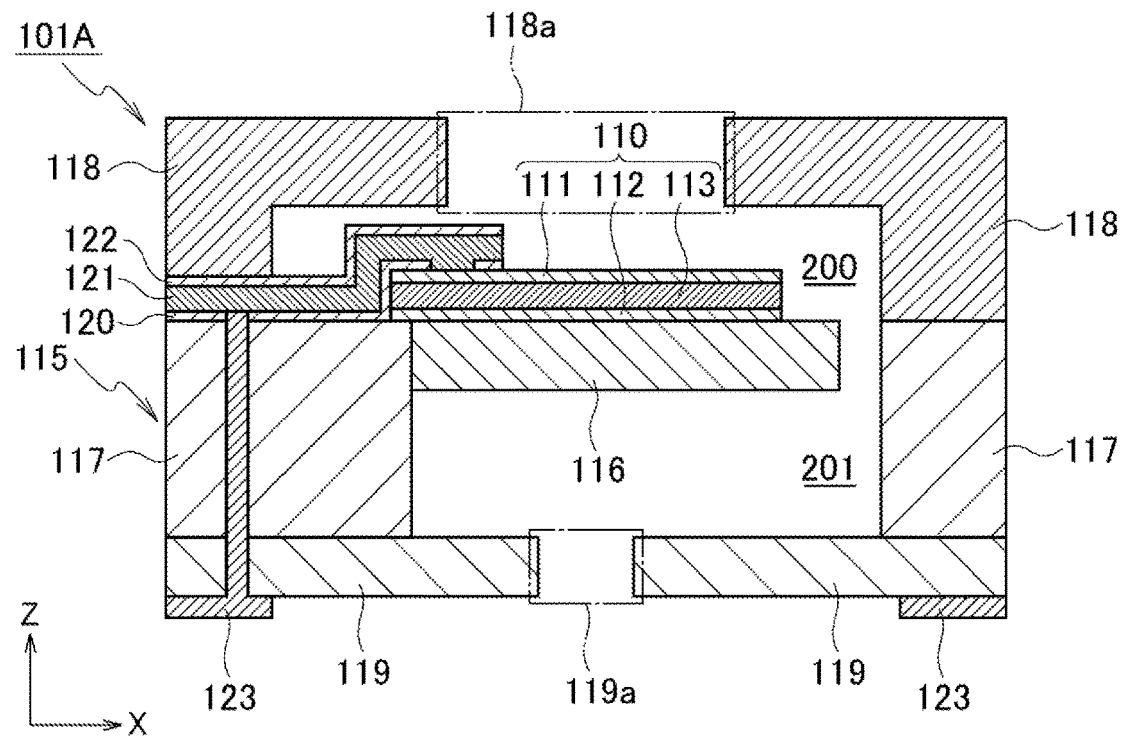
FIG. 23 is a cross-sectional view of a transducer according to a first modification.
Figure 24:
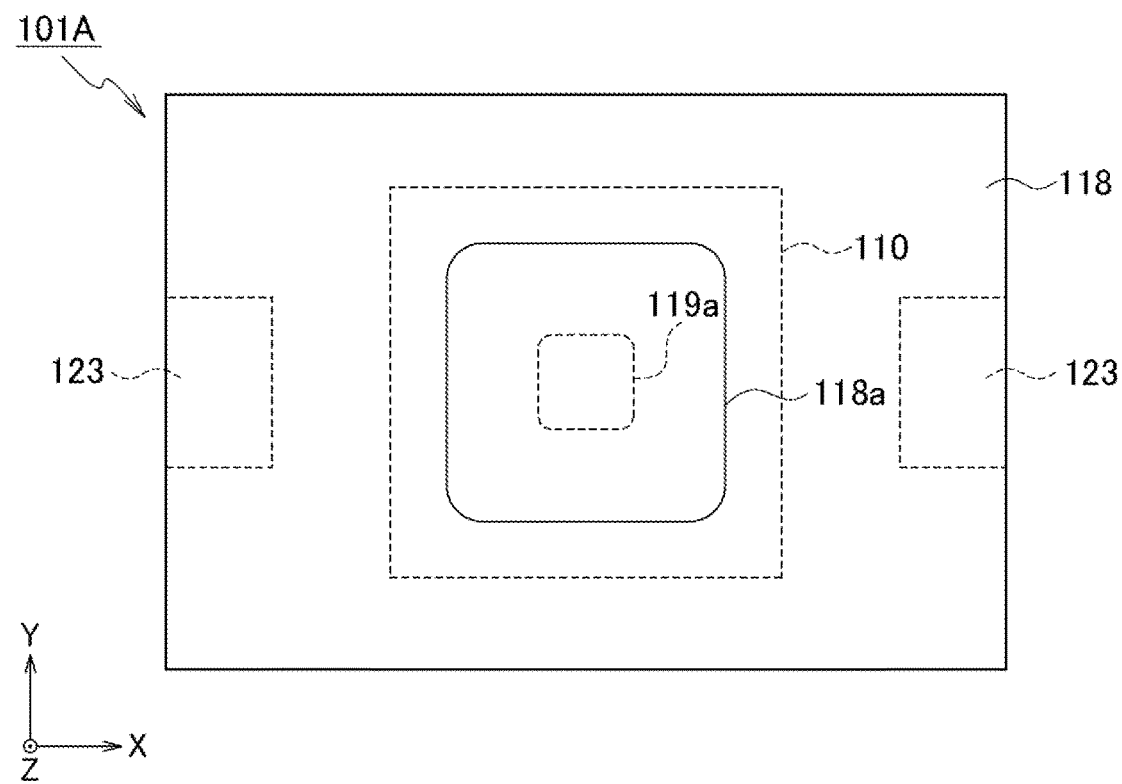
FIG. 24 is a top view of the transducer according to the first modification.

The configuration of a transducer 101A according to the first modification will be described with reference to FIGS. 23 and 24. The transducer 101A according to the first modification differs from the transducer 101 illustrated in FIGS. 21 and 22 in that wiring 123 connected to the wiring 121 is newly provided. In the first modification, the matters common to those of the transducer 101 illustrated in FIGS. 21 and 22 are covered by the aforementioned description, and the matters different from those of the transducer 101 will be described below in detail.

The wiring 123 is connected to the wiring 121 through a via provided in the film support portion 117. That is, the wiring 123 is electrically connected to the electrode 111 through the wiring 121. In addition, the wiring 123 may be electrically connected to the electrode 111 using wiring or the like provided on the outer wall of the film body 115. Surface mounting can be performed by providing the wiring 123 on the back surface of the substrate 119, and since this surface mounting method takes up less space than a wire bonding method, it is suitable to reduce the transducer in size.

<Second Modification>

Figure 25:
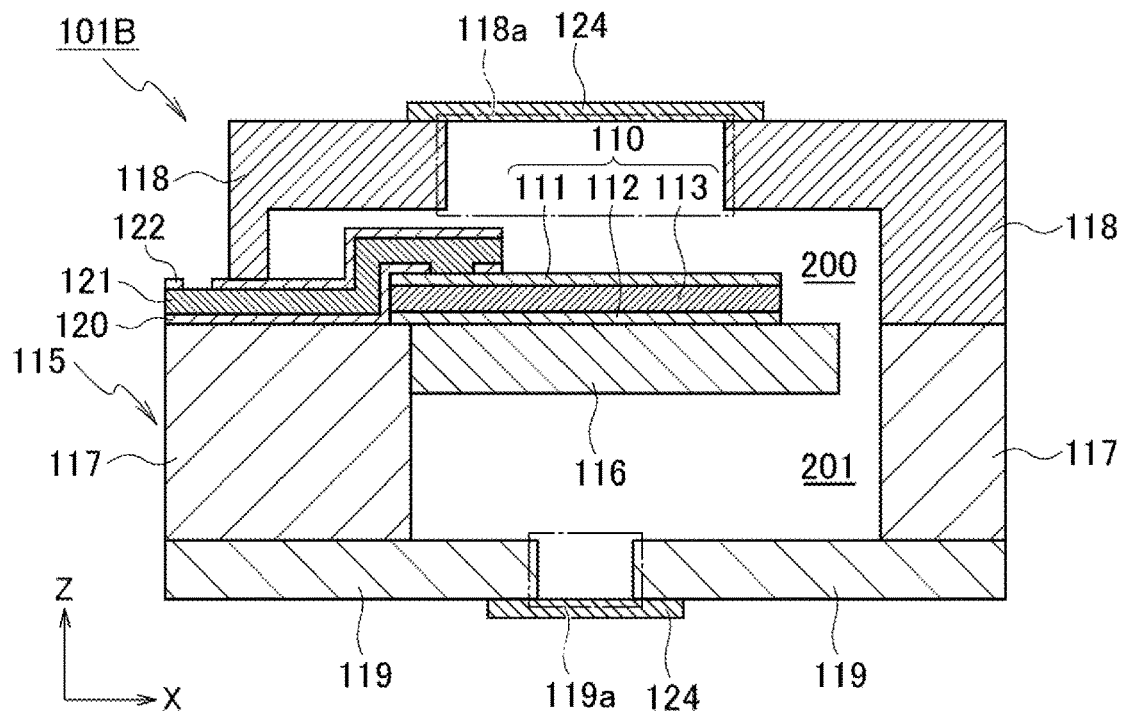
FIG. 25 is a cross-sectional view of a transducer according to a second modification.

The configuration of a transducer 101B according to the second modification will be described with reference to FIG. 25. The transducer 101B according to the second modification differs from the transducer 101 illustrated in FIGS. 21 and 22 in that a filter 124 covering the opening 118a and the opening 119a is newly provided. In the second modification, the matters common to those of the transducer 101 illustrated in FIGS. 21 and 22 are covered by the aforementioned description, and the matters different from those of the transducer 101 will be described below in detail.

The filter 124 is provided on the upper surface side of the abutment member 118 so as to close the opening 118a. The filter 124 is provided on the rear surface side of the substrate 119 so as to close the opening 119a. The filter 124 is formed in the form of a sheet and is formed of a material capable of allowing air to pass therethrough. The filter 124 may be a nonwoven fabric, or a fabric having a waterproof permeability such as Gore-Tex (registered trademark). The filter 124 may be provided on the lower surface side of the abutment member 118, or the upper surface side of the substrate 119. In addition, the filter 124 may be provided on the side surface of the abutment member 118, or the side surface of the film support portion 117, as in the third modification which will be described later.

By providing the filter 124, the opening 118a and/or the opening 119a are blocked by the filter 124, and thus it is possible to prevent dust or liquid from entering the internal spaces 200 and 201. Further, since the filter 124 is formed of a material for allowing air to pass therethrough, flow of air through the openings 118a and 119a can be maintained.

<Third Modification>

The configuration of a transducer 101C according to the third modification will be described with reference to FIGS. 26, 27A and 27B. The transducer 101C of the third modification differs from the transducer 101A of the first modification in that an abutment member 128 is used instead of the abutment member 118, a film support portion 127 is used instead of the film support portion 117, and a substrate 129 is used instead of the substrate 119. The air in the space 200 and the space 201 is made to flow to the outside through a slit 132 provided in the abutment member 128 and a slit 133 provided in the film support portion 127, instead of the opening 118a and the opening 119a. In the third modification, the matters common to those of the transducer 101A of the first modification are covered by the aforementioned description, and the matters different from those of the transducer 101A will be described below in detail.

The same material as that of the abutment member 118 can be used for the abutment member 128a. For example, when a material is etched to form a groove serving as the space 200, the abutment member 128 can be formed by simultaneously forming a slit. Further, the abutment member 128 can be formed by etching a material to form a groove serving as the space 200, and thereafter etching a portion of the inner surface of the groove to form a slit. From the viewpoint of the number of processes and the cost, it is preferable to simultaneously form the groove, which is the space 200, and the slit by using one photomask.

Figure 26:
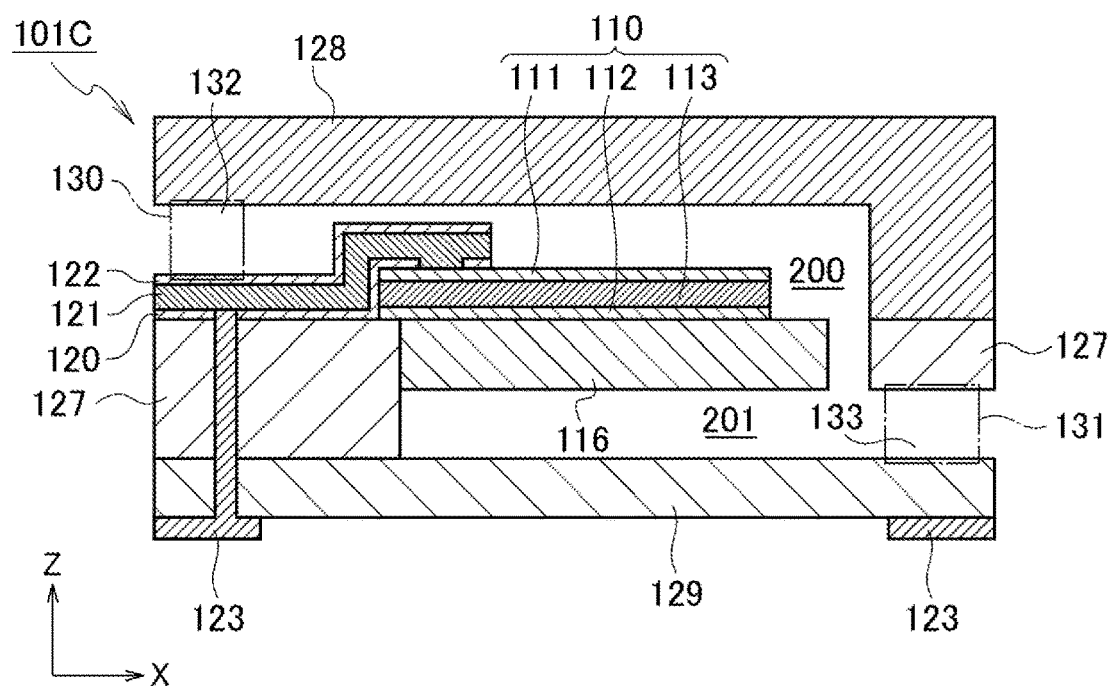
FIG. 26 is a cross-sectional view of a transducer according to a third modification.
Figure 27A:
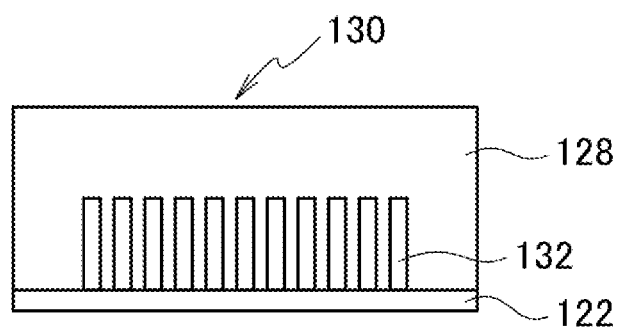
FIG. 27A is a cross-sectional view of slits 132 in a region 130 of the transducer according to the third modification when viewed from the air inflow/outflow side.

FIG. 27A is a cross-sectional view of the slits 132 in the region 130 illustrated in FIG. 26 when viewed from the inflow/outflow side (the left side in the page space) of air. As illustrated in FIG. 27A, the slits 132 provided in the abutment member 128 have a comb-shaped structure. Such a structure can prevent foreign matter (dust or liquid) from entering the internal space 200 from the outside. The slits 132 do not necessarily have a comb-tooth structure, and may have a lattice structure, for example, as long as they have a structure that can prevent foreign matter from entering the internal space 200 from the outside.

The same material as that of the film support portion 117 can be used for the film support portion 127. That is, the film body 115 includes the vibration film 116 and the film support portion 127. Accordingly, the vibration film 116 and the film support portion 127 are integrally formed by etching the back surface side of the film body 115. When the back surface side of the film body 115 is etched to form a groove serving as the space 201, the film support portion 127 can be formed by simultaneously forming a slit. Further, the film support portion 127 can be formed by etching the back surface side of the film body 115 to form a groove serving as the space 201, and thereafter etching a portion of the inner surface of the groove to form a slit. From the viewpoint of the number of processes and the cost, it is preferable to simultaneously form the groove, which is the space 201, and the slit by using one photomask.

Figure 27B:
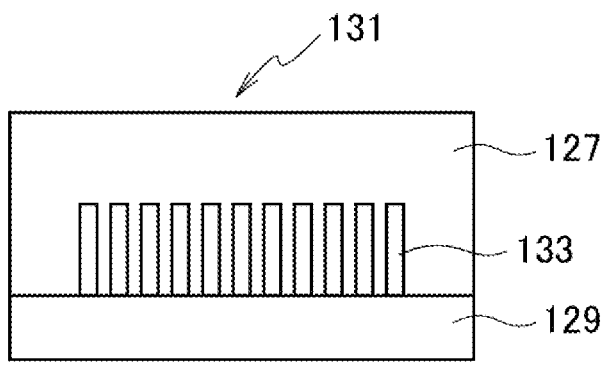
FIG. 27B is a cross-sectional view of slits 133 in a region 131 of the transducer according to the third modification when viewed from the air inflow/outflow side.

FIG. 27B is a cross-sectional view of the slits 133 in the region 131 illustrated in FIG. 26 when viewed from the inflow/outflow side (the right side in the page space) of air. As illustrated in FIG. 27B, the slits 133 provided in the film support portion 127 have a comb-like structure. Such a structure can prevent foreign matter (dust or liquid) from entering the internal space 201 from the outside. The slits 133 do not necessarily have a comb-tooth structure, and may have a lattice structure, for example, as long as they have a structure that can prevent foreign matter from entering the internal space 201 from the outside.

The slits 133 are provided in a direction diagonal to the slits 132. Specifically, the side surface of the film support portion 127 provided with the slits 133 is positioned in a direction diagonal to the side surface of the abutment member 128 provided with the slits 132 through the vibration film 116. With such a structure, the inflow and outflow of air to and from the outside can be efficiently performed.

<Fourth Modification>

Figure 28:
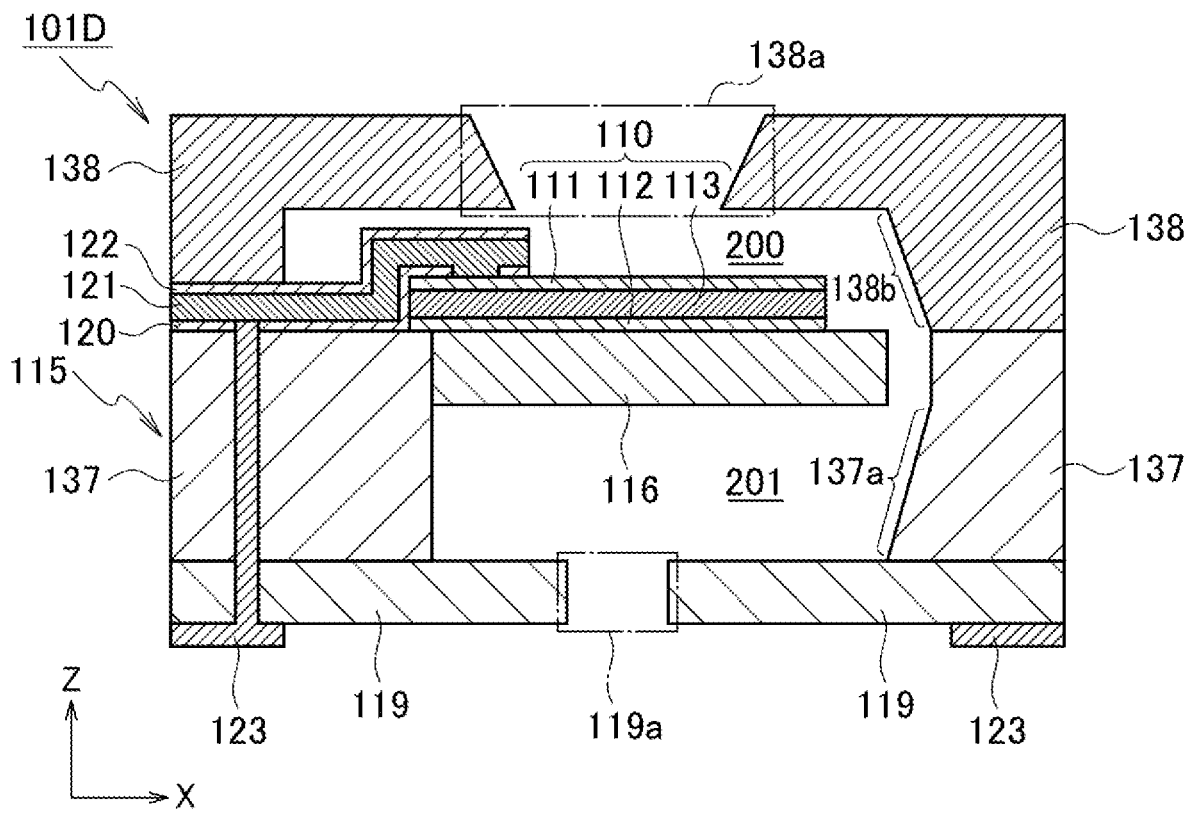
FIG. 28 is a cross-sectional view of a transducer according to a fourth modification.

The configuration of a transducer 101D according to the fourth modification will be described with reference to FIG. 28. The transducer 101D of the fourth modification differs from the transducer 101A of the first modification in that an abutment member 138 is used instead of the abutment member 118, and a film support portion 137 is used instead of the file support portion 117. In the fourth modification, the matters common to those of the transducer 101A of the first modification are covered by the aforementioned description, and the matters different from those of the transducer 101A will be described below in detail.

The same material as that of the abutment member 118 may be used for the abutment member 138. The abutment member 138 has an opening 138a, and the side surface of the abutment member 138 in the opening 138a is formed in a forward tapered shape. However, the side surface of the abutment member 138 in the opening 138a may be formed in a reverse tapered shape. The abutment member 138 has a side face 138b having a reverse tapered shape as an abutment surface. The distance (clearance) from the vibration film 116 can be reduced by having the side surface 138b. By reducing the clearance, an air leakage can be suppressed, and thus air can be efficiently vibrated.

The same material as that of the film support portion 117 can be used for the film support portion 137. The film support portion 137 has a tapered side surface 137a. The film body 115 includes the vibration film 116 and the film support portion 137. Accordingly, the vibration film 116 and the film support portion 137 are integrally formed by etching the back surface side of the film body 115. The film support portion 137 can be formed by etching the back surface side of the film body 115 to form a groove serving as the space 201, and thereafter etching a portion of the inner surface of the groove to form the side surface 137a. By providing the side surface 137a, the distance (clearance) from the vibration film 116 can be reduced. By reducing the clearance, an air leakage can be suppressed, and thus air can be efficiently vibrated.

<Fifth Modification>

Figure 29:
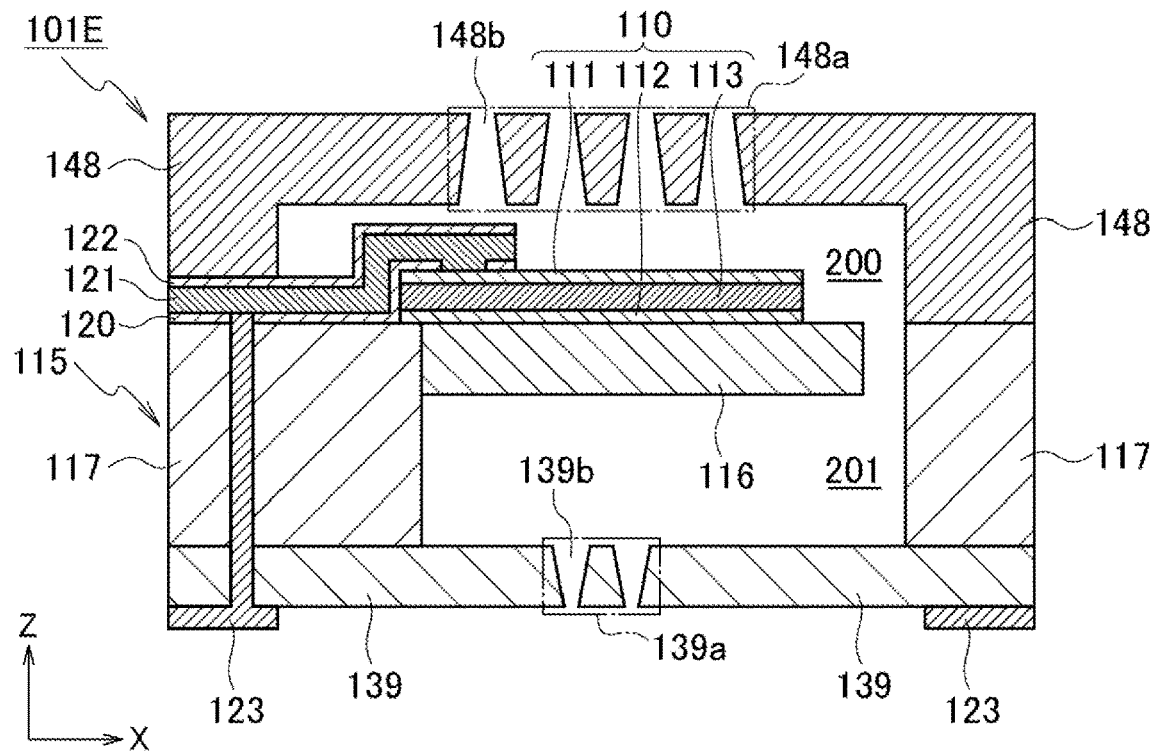
FIG. 29 is a cross-sectional view of a transducer according to a fifth modification.
Figure 30:
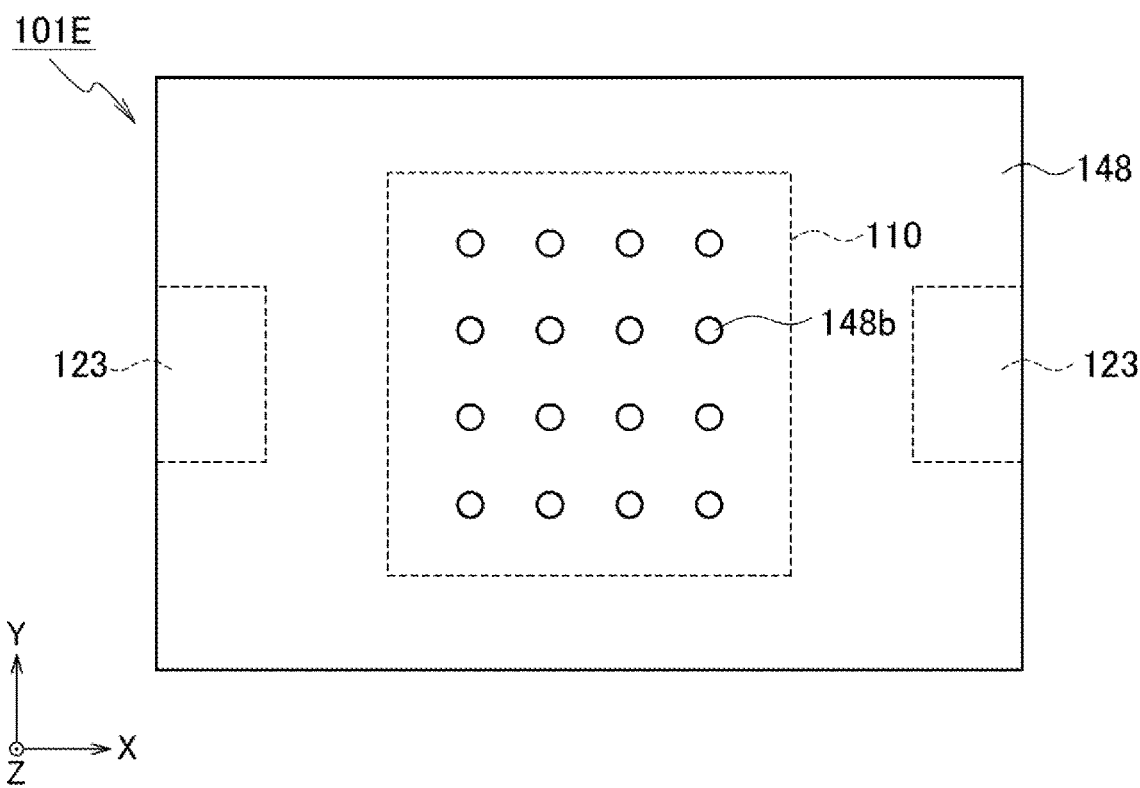
FIG. 30 is a top view of a transducer according to a fifth modification.

The configuration of a transducer 101E according to the fifth modification will be described with reference to FIGS. 29 and 30. The transducer 101E of the fifth modification differs from the transducer 101A of the first modification in that an abutment member 148 is used instead of the abutment member 118, and a substrate 139 is used instead of the substrate 119. In the fifth modification, the matters common to those of the transducer 101A of the first modification are covered by the aforementioned description, and the matters different from those of the transducer 101A will be described below in detail.

The same material as that of the abutment member 118 may be used for the abutment member 148. The abutment member 148 has an opening 148a, and through-holes 148b are formed in the opening 148a. It is preferable that the through-hole 148b becomes smaller as the distance from the vibration film 116 increases. By having such through-holes 148b, it is possible to prevent foreign matter (dust or liquid) from entering the internal space 200 from the outside. Further, it is preferable to increase the diameter of the through-holes 148b adjacent to the distal end of the vibration film 116, because the air in the vicinity of the distal end of the vibration film 116 having a large displacement amount of the vibration film 116 can be more efficiently vibrated. Further, it is preferable that the density of the through-holes 148b having the same diameters in the vicinity of the distal end of the vibration film 116 is made higher than the density of the through-holes 148b provided other than in the vicinity of the distal end of the vibration film 116, because the air in the vicinity of the distal end of the vibration film 116 can be more efficiently vibrated.

The same material as that of the substrate 119 may be used for the substrate 139. The substrate 139 has an opening 139a, and through-hole a 139b are formed in the opening 139a. It is preferable that the through-hole 139b becomes smaller as the distance from the vibration film 116 increases. By having such through-holes 139b, it is possible to prevent foreign matter (dust or liquid) from entering the internal space 201 from the outside. Further, it is preferable to increase the diameter of the through-holes 139b adjacent to the distal end of the vibration film 116, because the air in the vicinity of the distal end of the vibration film 116 having a large displacement amount of the vibration film 116 can be more efficiently vibrated. Further, it is preferable that the density of the through-holes 139b having the same diameters in the vicinity of the distal end of the vibration film 116 is made higher than the density of the through-holes 139b provided other than in the vicinity of the distal end of the vibration film 116, because the air in the vicinity of the distal end of the vibration film 116 can be more efficiently vibrated.

As described above, although several modifications have been described, the statements and drawings forming part of the disclosure should be understood as illustrative and not limiting. Various alternative modifications and operational techniques will be apparent to those skilled in the art from this disclosure.

Sixth Embodiment

Figure 31A:
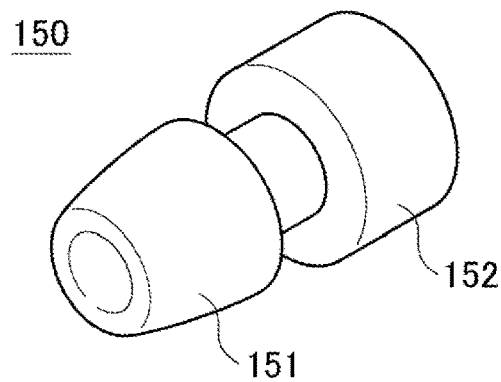
FIG. 31A is an overall view of an earphone, which is an example of an electronic device according to a sixth embodiment.

An electronic device according to the sixth embodiment will be described. The electronic device according to the sixth embodiment includes a speaker unit, and a housing for housing the speaker unit. An example of the electronic device is an earphone. An earphone 150 illustrated in FIG. 31A has an earpiece 151 and a housing 152.

Figure 31B:
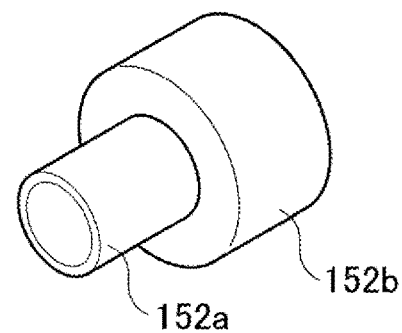
FIG. 31B is a diagram illustrating a housing of an earphone, which is an example of the electronic device according to the sixth embodiment.

FIG. 31B is a diagram in which the earpiece 151 is removed from the earphone 150, and is a diagram for illustrating the shape of the housing 152. The housing 152 has a bottomed cylindrical shape, and includes a cylindrical portion 152a and a bottom portion 152b which abuts the cylindrical portion 152a. The speaker unit is arranged in a portion of the cylindrical portion 152a and a portion of the bottom portion 152b. The arrangement of the housing 152 and the speaker unit (mounting of the speaker unit) will be described below.

Mounting Example 1

Figure 32:
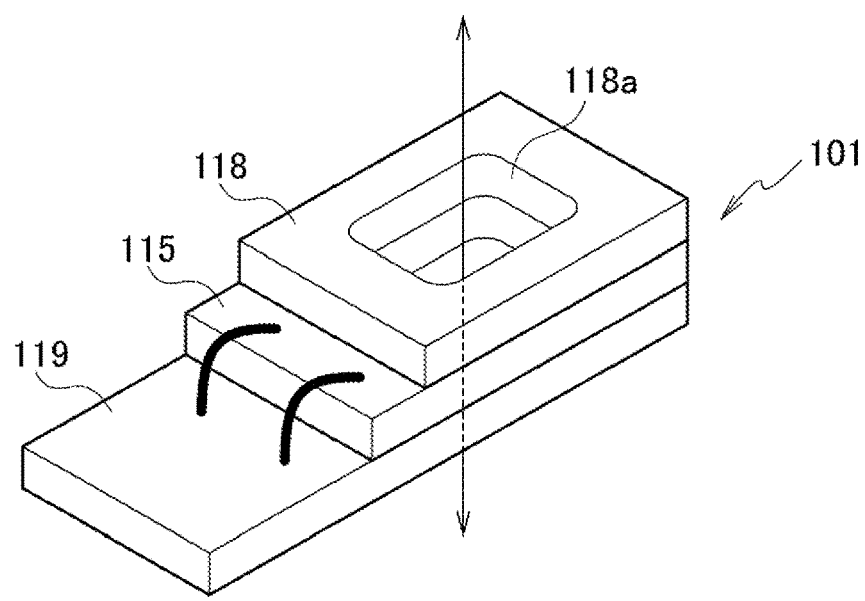
FIG. 32 is a diagram illustrating a configuration of a speaker unit in a mounting example 1.

As illustrated in FIG. 32, the speaker unit (transducer 101) has a structure in which the film body 115 and the abutment member 118 are provided on the substrate 119. The vent holes (specifically, the openings 118a and 119a illustrated in FIG. 33) are provided in the film thickness direction (the direction indicated by the arrow in the figure) of the transducer 101 (the substrate 119, the film body 115, and the abutment member 118).

Figure 33:
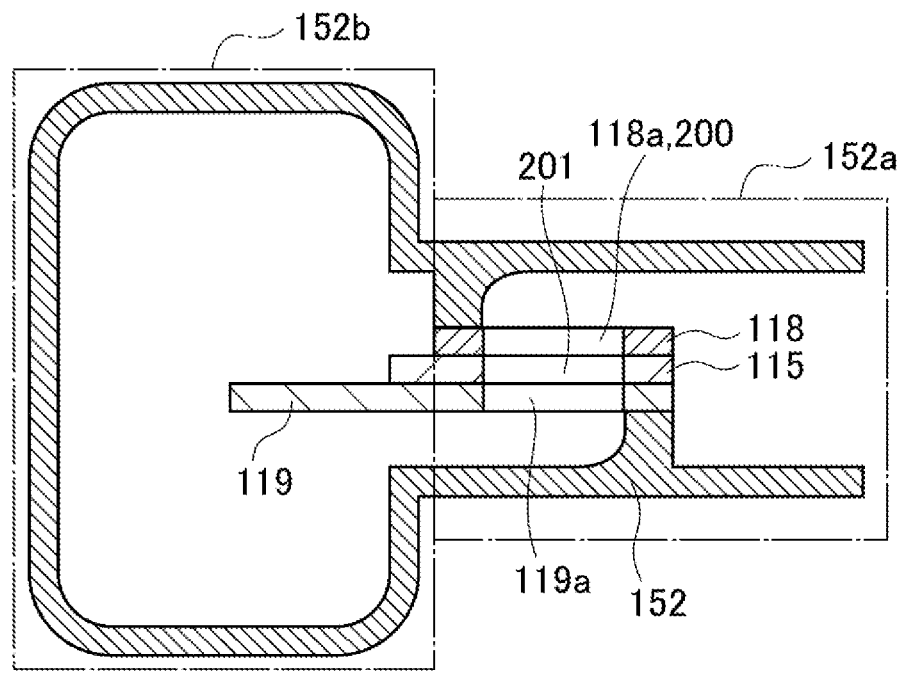
FIG. 33 is a cross-sectional view of an earphone in the mounting example 1.

FIG. 33 is a cross-sectional view of the earphone in which the transducer 101 is mounted in the housing 152. The substrate 119 is arranged in a portion of the cylindrical portion 152a and a portion of the bottom portion 152b, and the film body 115 and the abutment member 118 are provided on the substrate 119. The substrate 119 has the opening 119a, and the abutment member 118 has the opening 118a. The film body 115 includes the vibration film and the film support portion. The bottom portion 152b is separated from the cylindrical portion 152a with the transducer 101 therebetween, and the space of the bottom portion 152b communicates with the outside of the housing 152 through the openings 118a and 119a. The transducer 101 according to the mounting example 1 can be, for example, the transducer 101 according to the first embodiment illustrated in FIGS. 21 and 22, and the space of the bottom portion 152b communicates with the outside of the housing 152 through the opening 118a, the space 200, the space 201, and the opening 119a.

The airflow between the cylindrical portion 152a and the bottom portion 152b is blocked by the structure separating the cylindrical portion 152a and the bottom portion 152b through the transducer 101. As a result, the housing 152 can be used as a space for mounting other devices, batteries, and the like therein, thereby making it possible to reduce the size of the housing 152.

Mounting Example 2

Figure 34:
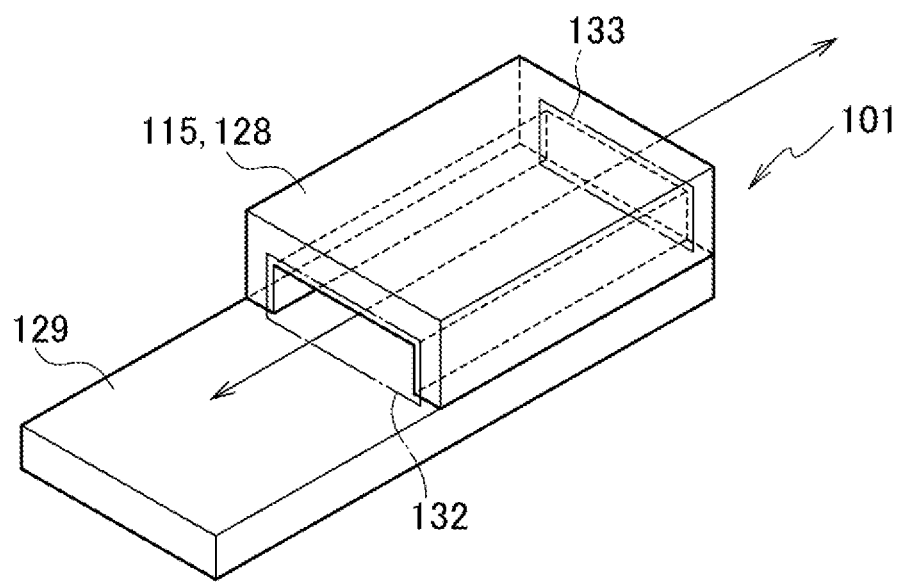
FIG. 34 is a diagram illustrating a configuration of a speaker unit in a mounting example 2.

As illustrated in FIG. 34, the speaker unit (transducer 101) has a structure in which the film body 115 and the abutment member 128 are provided on the substrate 129. The vent holes (specifically, the slit 132 and the slit 133 illustrated in FIG. 35) are provided on the side surface of the transducer 101 (the substrate 129, the film body 115, and the abutment member 128). That is, air flows in the direction indicated by the arrow in the figure.

Figure 35:
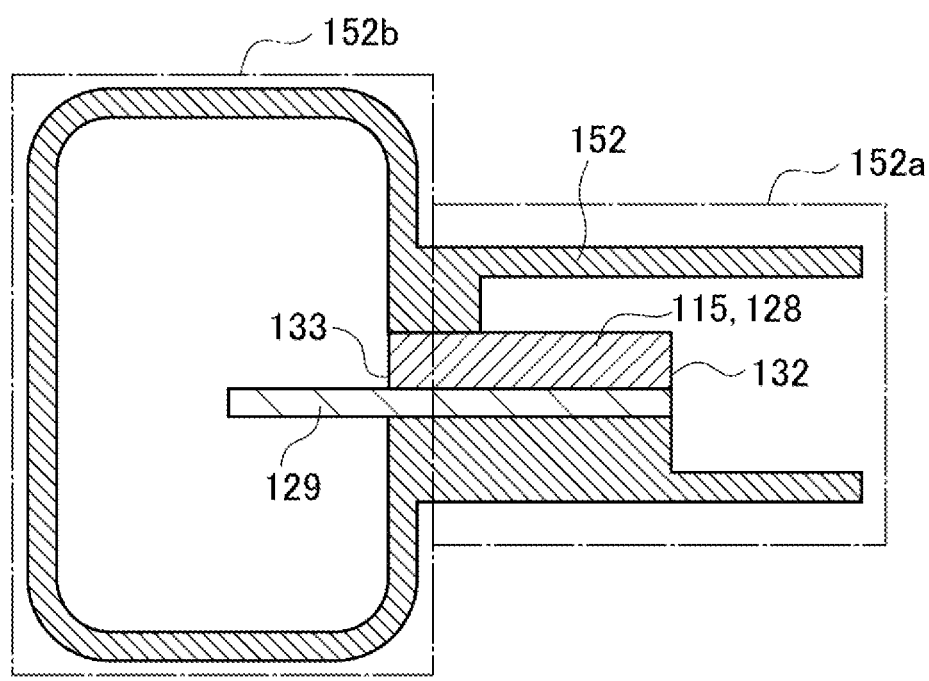
FIG. 35 is a cross-sectional view of an earphone in the mounting example 2.

FIG. 35 is a cross-sectional view of the earphone in which the transducer 101 is mounted in the housing 152. The substrate 129 is arranged in a portion of the cylindrical portion 152a and a portion of the bottom portion 152b, and the film body 115 and the abutment member 128 are provided on the substrate 129. The film body 115 includes the vibration film and the film support portion. The abutment member 128 has the slit 132, and the film support portion of the film body 115 has the slit 133. The bottom portion 152b is separated from the cylindrical portion 152a with the transducer 101 therebetween, and the space of the bottom portion 152b communicates with the outside of the housing 152 through the slits 132 and 133. The transducer 101 according to the mounting example 2 can be, for example, the transducer 101C according to the third modification illustrated in FIG. 26, and the space of the bottom portion 152b communicates with the outside of the housing 152 through the slit 132, the space 200, the space 201, and the slit 133.

The airflow between the cylindrical portion 152a and the bottom portion 152b is blocked by the structure separating the cylindrical portion 152a and the bottom portion 152b through the transducer 101. As a result, the housing 152 can be used as a space for mounting other devices, batteries, and the like therein, thereby making it possible to reduce the size of the housing 152.

Other Embodiments

As described above, although some embodiments have been described, the statements and drawings forming part of the disclosure are exemplary and should not be understood as limiting. A variety of alternative embodiments, examples, and operational techniques will become apparent to those skilled in the art from this disclosure.

For example, the transducer may be applied to an application for receiving sound waves in addition to transmitting sound waves. The transducer is not limited to an application for sound waves, and may be applied to an application for transmitting or receiving ultrasonic waves.

The invention claimed is:
1. A transducer comprising:
a film support portion having a hollow portion;
a vibration film connected to the film support portion and displaceable in a film thickness direction of the film support portion;
a piezoelectric element on the vibration film, the piezoelectric element including a pair of electrodes and a piezoelectric film sandwiched between the pair of electrodes; and
in regions overlapping the hollow portion, a plurality of first regions having a first total film thickness of the first regions which is a sum of a film thickness of the vibration film and a film thickness of the piezoelectric element in the first regions, and a plurality of second regions having a second total film thickness of the second regions which is a sum of a film thickness of the vibration film and a film thickness of the piezoelectric element in the second regions, the second total film thickness being different from the first total film thickness, wherein the first regions and the second regions are alternately arranged, and one of the first regions is adjacent to a connection portion between the film support portion and the vibration film.

2. The transducer according to claim 1, wherein one of the second regions is parallel to the connection portion.

3. The transducer according claim 1, wherein a width of one of the second regions is different from a width of another one of the second regions.

4. The transducer according to claim 1, wherein the piezoelectric element includes a piezoelectric slit.

5. A transducer comprising:

a film support portion having a hollow portion;

a vibration film connected to the film support portion and displaceable in a film thickness direction of the film support portion;

a piezoelectric element on the vibration film, the piezoelectric element including a pair of electrodes, a piezoelectric film sandwiched between the pair of electrodes, and a plurality of buffer layers on the pair of electrodes; and in regions overlapping the hollow portion, first regions configured not to include the buffer layers, and second regions configured to include the buffer layers, wherein the first regions and the second regions are alternately arranged, and one of the first regions is adjacent to a connection portion between the film support portion and the vibration film.

6. The transducer according to claim 5, wherein the buffer layers are divided in one of the second regions.

7. The transducer according to claim 5, wherein a width of the buffer layers in one of the second regions is larger than a width of the buffer layers in another one of the second regions provided farther than the one of the second regions from the connection portion.

8. The transducer according to claim 5, wherein the buffer layers in one of the second regions increase in width toward a central portion in a longitudinal direction.

9. The transducer according to claim 5, wherein the buffer layers include a plurality of layers made of different materials.

10. The transducer according to claim 5, wherein a quantity of layers including the buffer layers in one of the second regions is different from a quantity of layers including the buffer layers in another one of the second regions.

11. The transducer according to claim 5, wherein one of the second regions is parallel to the connection portion.

12. The transducer according claim 5, wherein a width of one of the second regions is different from a width of another one of the second regions.

13. The transducer according to claim 5, wherein the piezoelectric element includes a piezoelectric slit.

14. A transducer comprising:

a film support portion having a hollow portion;

a vibration film connected to the film support portion and displaceable in a film thickness direction of the film support portion; and a piezoelectric element on the vibration film, the piezoelectric element including a pair of electrodes and a piezoelectric film sandwiched between the pair of electrodes; wherein the vibration film includes a plurality of recesses, in regions overlapping the hollow portion, the transducer includes first regions configured not to include the recesses, and second regions configured to include the recesses, the first regions and the second regions are alternately arranged, one of the first regions is adjacent to a connection portion between the film support portion and the vibration film, and one of the second regions is parallel to the connection portion.

15. The transducer according to claim 14, wherein the recesses are arranged on a back surface of the vibration film.

* * * * *